United States Patent
Yoshihara

(10) Patent No.: US 7,954,020 B2
(45) Date of Patent: *May 31, 2011

(54) METHOD AND APPARATUS FOR TESTING A CIRCUIT

(75) Inventor: Hiroshi Yoshihara, Round Rock, TX (US)

(73) Assignee: Sony Computer Entertainment Inc., Tokyo (JP)

(*) Notice: Subject to any disclaimer, the term of this patent is extended or adjusted under 35 U.S.C. 154(b) by 841 days.

This patent is subject to a terminal disclaimer.

(21) Appl. No.: 11/758,743

(22) Filed: Jun. 6, 2007

(65) Prior Publication Data

US 2008/0304343 A1    Dec. 11, 2008

(51) Int. Cl.
    *G11C 29/00*    (2006.01)
    *G01R 31/28*    (2006.01)

(52) U.S. Cl. ......................... 714/719; 714/736

(58) Field of Classification Search .................. 714/735, 714/736, 738, 733, 734, 724, 718, 719, 819, 714/30; 365/200, 201
See application file for complete search history.

(56) References Cited

U.S. PATENT DOCUMENTS

| | | | | |
|---|---|---|---|---|
| 5,646,948 A | * | 7/1997 | Kobayashi et al. | 714/719 |
| 6,553,528 B1 | * | 4/2003 | Komoike | 714/736 |
| 6,948,096 B2 | * | 9/2005 | Parvathala et al. | 714/30 |
| 7,024,598 B2 | * | 4/2006 | Jeong et al. | 714/704 |
| 7,058,865 B2 | | 6/2006 | Mori et al. | |
| 7,119,567 B2 | * | 10/2006 | Ma et al. | 324/763 |
| 7,222,272 B2 | * | 5/2007 | Takazawa et al. | 714/718 |
| 7,360,116 B2 | * | 4/2008 | Nakamura | 714/30 |
| 7,426,663 B2 | * | 9/2008 | Takazawa et al. | 714/718 |
| 7,449,909 B2 | * | 11/2008 | Ma et al. | 324/763 |
| 7,506,225 B2 | * | 3/2009 | Gerowitz et al. | 714/718 |
| 7,603,695 B2 | * | 10/2009 | Kim et al. | 725/151 |
| 2006/0013046 A1 | * | 1/2006 | Kim et al. | 365/189.05 |
| 2008/0244341 A1 | | 10/2008 | Yoshihara | |

OTHER PUBLICATIONS

Office Action for co-pending U.S. Appl. No. 11/691,838 dated: Jun. 11, 2009.
Co-pending U.S. Appl. No. 11/691,838, filed Mar. 27, 2007.

* cited by examiner

*Primary Examiner* — Phung M Chung
(74) *Attorney, Agent, or Firm* — Matthew B. Dernier; Gibson & Dernier LLP

(57) ABSTRACT

A system and method for testing a memory array are disclosed which may include establishing a stored data vector, including a plurality of data bits, within at least one circuit; applying one or more logical operations on the stored data vector to generate a succession of original data vectors at the at least one circuit; transmitting the succession of original data vectors through a memory array to provide a succession of exercised data vectors; comparing the succession of exercised data vectors to the succession of respective original data vectors; and determining whether the memory array passes or fails based on the comparing step.

45 Claims, 13 Drawing Sheets

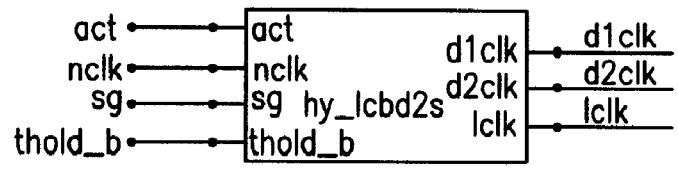
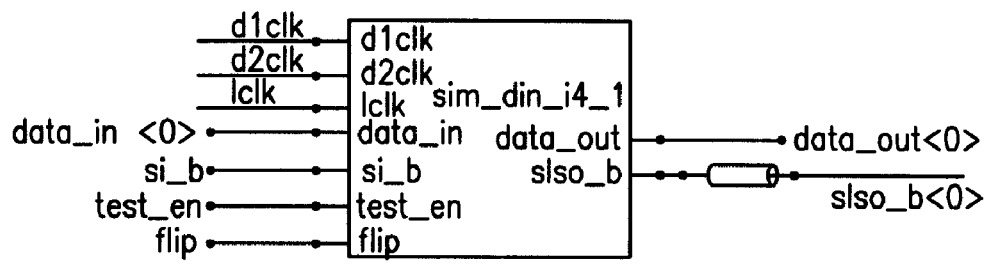
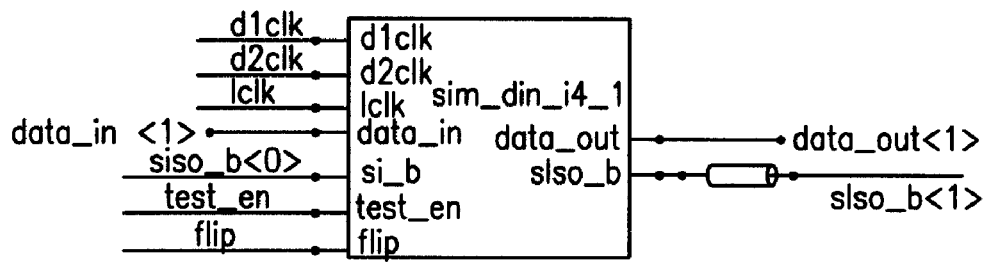
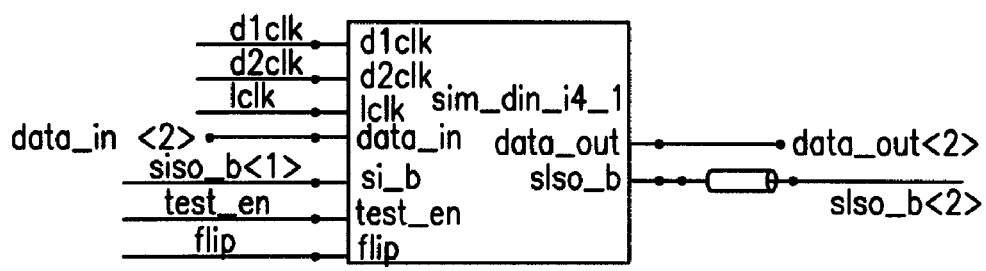
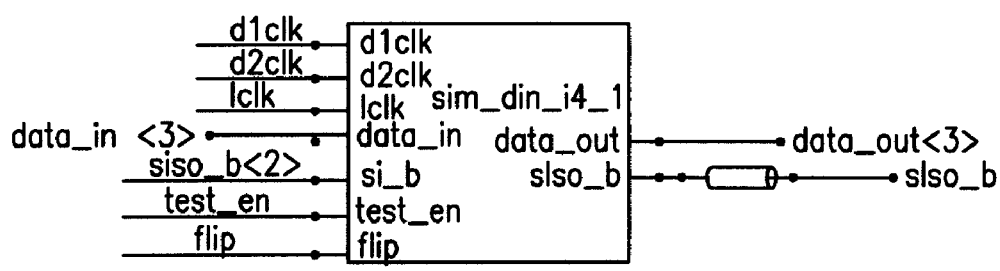
*FIG. 5*

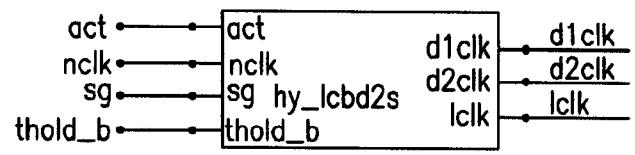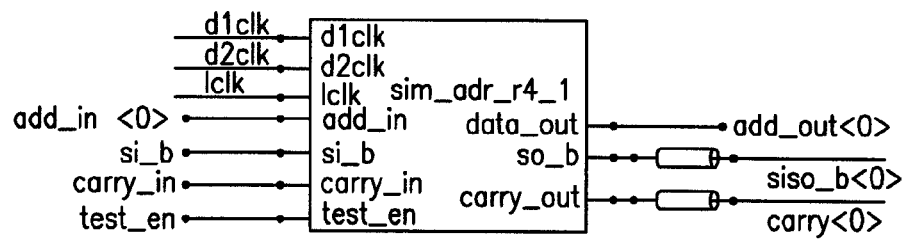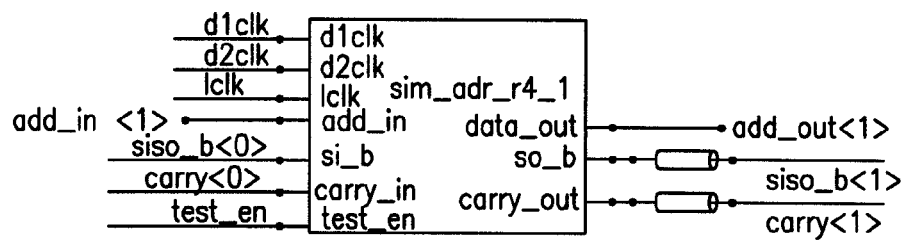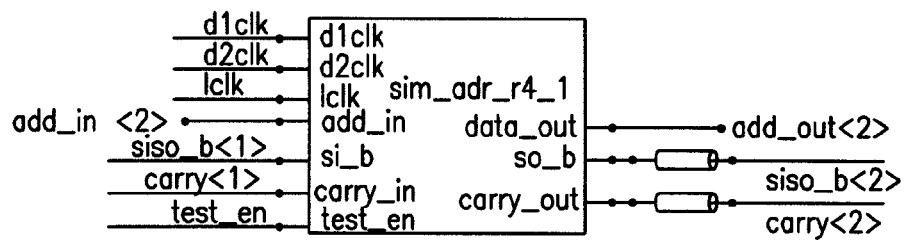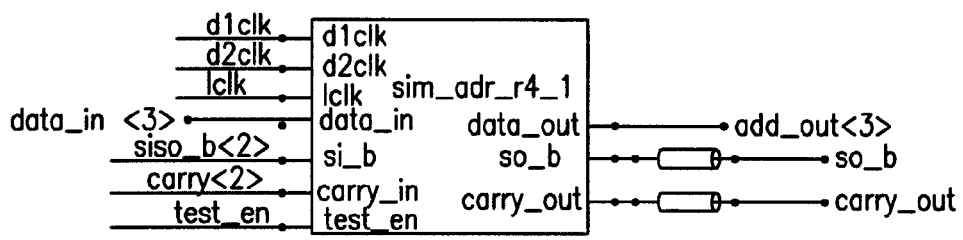
FIG. 9

METHOD AND APPARATUS FOR TESTING A CIRCUIT

CROSS-REFERENCE TO RELATED APPLICATIONS

This application is related to U.S. Pat. No. 7,673,196, entitled "METHOD AND APPARATUS FOR COMMUNICATING WITH A TARGET CIRCUIT", which is incorporated by reference herein in its entirety.

BACKGROUND OF THE INVENTION

The present invention relates to systems and methods for AC testing of a target circuit.

In general, testing a target circuit, such as an integrated circuit (IC), prior to packaging may reveal problems associated with the individual ICs and also with the IC fabrication process preceding the packaging step. Testing an IC after packaging may reveal problems arising from the packaging process steps, such as die attachment, wire bonding, among other steps.

So called scan chain testing techniques may be employed for testing IC circuits before and/or after packaging. Existing scan chain test operations for DC testing include scanning a known sequence of bits into a series of respective latches (flip flops) within the IC circuit. The latches are selected to direct the scanned bits to the input(s) of the target circuit, such as combinational logic, Static Random Access Memory (SRAM), etc. The target circuit is provided with a significant amount of time to let the input sequence of bits settle at the input(s) and outputs of the gates, memory cells, etc., such that test output bits are produced in response to the input bits. In other words, no dynamic testing is conducted. The output bits are directed to a selected series of output latches of the IC. Commands are then issued to scan the test output bits from the output latches, and the output bits are compared to a known template to determine whether the target circuit is operational.

Notably, the input latches and output latches are typically already part of the IC and, under normal operating modes, perform functions that permit the IC to operate. The testing designer, however, selects the input and output latches from among the latches of the IC to be used in the scan chain testing process. Selector circuits may be employed to switch the input/output connections of the selected latches between normal operating modes and the scan chain testing mode. Since the DC scan chain testing process does not perform dynamic (AC) testing, virtually any of the existing latches of the IC may be selected as input/output latches for the scan chain test process no matter where (how far) they may be located relative to the inputs/output of the target circuit, the impedances of the interconnections, or potential sources of electromagnetic interference.

Existing systems for AC testing may also involve selecting input and output latches from among existing latches of the IC to be used in an AC testing process. However, since a dynamic test is desired, the input bits to the target circuit must be rapidly provided in order to exercise the target circuit in ways that may uncover defects, such as input/output set up times, propagation delays, impedance characteristics, electromagnetic interference sources, etc. Thus, AC testing techniques typically use a CPU (Central Processing Unit) external to the target circuit to drive data into and out of selected input/output latches adjacent to the target circuit. Generally, the CPU is coupled to respective input and output connections for a portion of a circuit being tested which are generally within a limited, localized region of the test circuit. However, it is cumbersome and complex to connect an external CPU in this manner to all portions of a circuit for which testing is sought.

A special case of circuit testing is that of Array Built In Self Test (ABIST). An ABIST circuit can include an ABIST engine, an array macro, which in turn includes a memory array, and communication links between the ABIST engine and the array macro.

Herein, an array macro generally corresponds to a circuit that includes a memory array which may also be referred to as a "memory core" and additional functionality to enable communication between the memory core and devices external to the array macro.

For DC testing, the ABIST engine generates "write data" (for storage in the array) and address values and sends both to scannable latches in the array macro. Thereafter, the storage data are stored in the specified addresses in a memory array within the array macro. The ABIST engine then issues a read instruction to the array macro, retrieves output data from the array macro, and compares the retrieved data to expectation data generated by the ABIST engine. The functionality of the array macro is then determined by comparing the expectation data (which generally corresponds to the original write data) with the data retrieved from the array macro.

While the above process is effective for DC testing an array macro, the speed at which data can be provided to the memory array is limited by the rate at which the write data and address values can be transmitted from the ABIST engine to the scannable latches of the array macro. A few cycles of continuous data transmission to the memory array may be obtained by using multiple sets of (such as two or three) input latches for inputting data to a single set of memory array input lines. However, it is cumbersome to add hardware to the array macro in this manner. Moreover, sending only two or three sets of input "write data" in rapid succession, for AC testing purposes, does not sufficiently exercise the various features of the array macro for circuit evaluation purposes.

A similar problem exists with regard to reading data from the target circuit, and comparing the read data to a known template for evaluation purposes. Specifically, the deployment of a serial communication link to direct read data out of an array macro to an ABIST engine may serve as a data traffic bottleneck for the process of extracting data from the target circuit. Slowing down the data transfer out of a memory array to accommodate the data communication bandwidth of this serial link would remove the ability to test the dynamic characteristics of the memory array during high frequency operation, which is representative of the circuit under normal operating conditions.

Accordingly, it would be desirable to be able to write data to a target circuit, read data from the target circuit, and compare the read data to a known template rapidly enough to enable testing the dynamic characteristics of the circuit under test.

SUMMARY OF THE INVENTION

According to one aspect, the invention is directed to a method for testing a memory array, which may include: establishing a stored data vector, including a plurality of data bits, within at least one circuit; applying one or more logical operations on the stored data vector to generate a succession of original data vectors at the at least one circuit; transmitting the succession of original data vectors through a memory array to provide a succession of exercised data vectors; comparing the succession of exercised data vectors to the succession of respective original data vectors; and determining whether the memory array passes or fails based on the comparing step.

According to another aspect, the invention is directed to a method for testing a memory array, which may include: applying a first set of one or more logical operations to generate a plurality of successive data vectors; storing the succession of data vectors in the memory array; applying a second set of one or more logical operations to generate a plurality of successive expectation data values; reading the plurality of data vectors from the memory array; comparing the plurality of expectation data values to the plurality of respective read data vectors; and determining whether the memory array passes or fails based on the comparing step.

In accordance with yet another aspect, the invention is directed to a method for testing a memory array, which may include: providing a initial data vector, having a plurality of bits, in a write circuit; performing at least one logical operation on the data vector to generate a plurality of successive data vectors; and storing the plurality of successive data vectors in a plurality of respective locations in the memory array.

In accordance with yet another aspect, the invention is directed to a method for testing a memory array, comprising: providing an initial expectation data value, having a plurality of bits, in an expectation data circuit; conducting at least one logical operation on the expectation data value to generate a plurality of successive expectation data values; reading a plurality of data vectors from the memory array; comparing each generated expectation data value to a corresponding one of the read data vectors, each generated expectation data value and each corresponding read data vector forming a vector pair; and determining whether the memory array passes or fails based on the comparing step.

Other aspects, features, advantages, etc. will become apparent to one skilled in the art when the description of the preferred embodiments of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 5 is a schematic diagram of a circuit suitable for implementing one embodiment of the write data generator of FIG. 4, in accordance with one or more embodiments of the present invention;

FIG. 9 is schematic diagram of a circuit suitable for implementing a portion of the circuit of FIG. 8, in accordance with one or more embodiments of the present invention;

DETAILED DESCRIPTION OF THE PREFERRED EMBODIMENTS

Herein, the term "DC testing" generally corresponds to circuit testing which tests the steady state response of a target circuit, or simply "target." The target may be initially in a stable condition, then receive test input data, and then generate test output data, based on logical operations and/or on memory location accesses, by the target. In DC testing, the target is generally permitted to reach a steady-state condition and to then allow test output data to be extracted therefrom. The target circuit is provided with a significant amount of time to let the input sequence of bits settle at the input(s) and outputs of the gates, memory cells, etc., such that test output bits are produced in response to the input bits. In other words, no dynamic testing is conducted.

Herein, the term "AC testing" generally corresponds to circuit testing in which the dynamic response of a target is tested. The target may initially be in a stable condition. Thereafter, one or more streams of data bits may be transmitted to the target at a relatively rapid rate, generally corresponding to the conditions the target would experience during normal operation thereof within an integrated circuit. In AC testing, the target is generally not given extra time to guarantee that all regions of the target stabilize before sending additional data and/or scanning output data from the target. Indeed, as a dynamic test is desired, the input bits to the target circuit must be rapidly provided in order to exercise the target circuit in ways that may uncover defects, such as input/output set up times, propagation delays, impedance characteristics, electromagnetic interference sources, etc. In this manner, the real-time, dynamic characteristics of the target, such as race conditions, etc., among other characteristics, may be evaluated when employing AC testing techniques.

Figure 1:
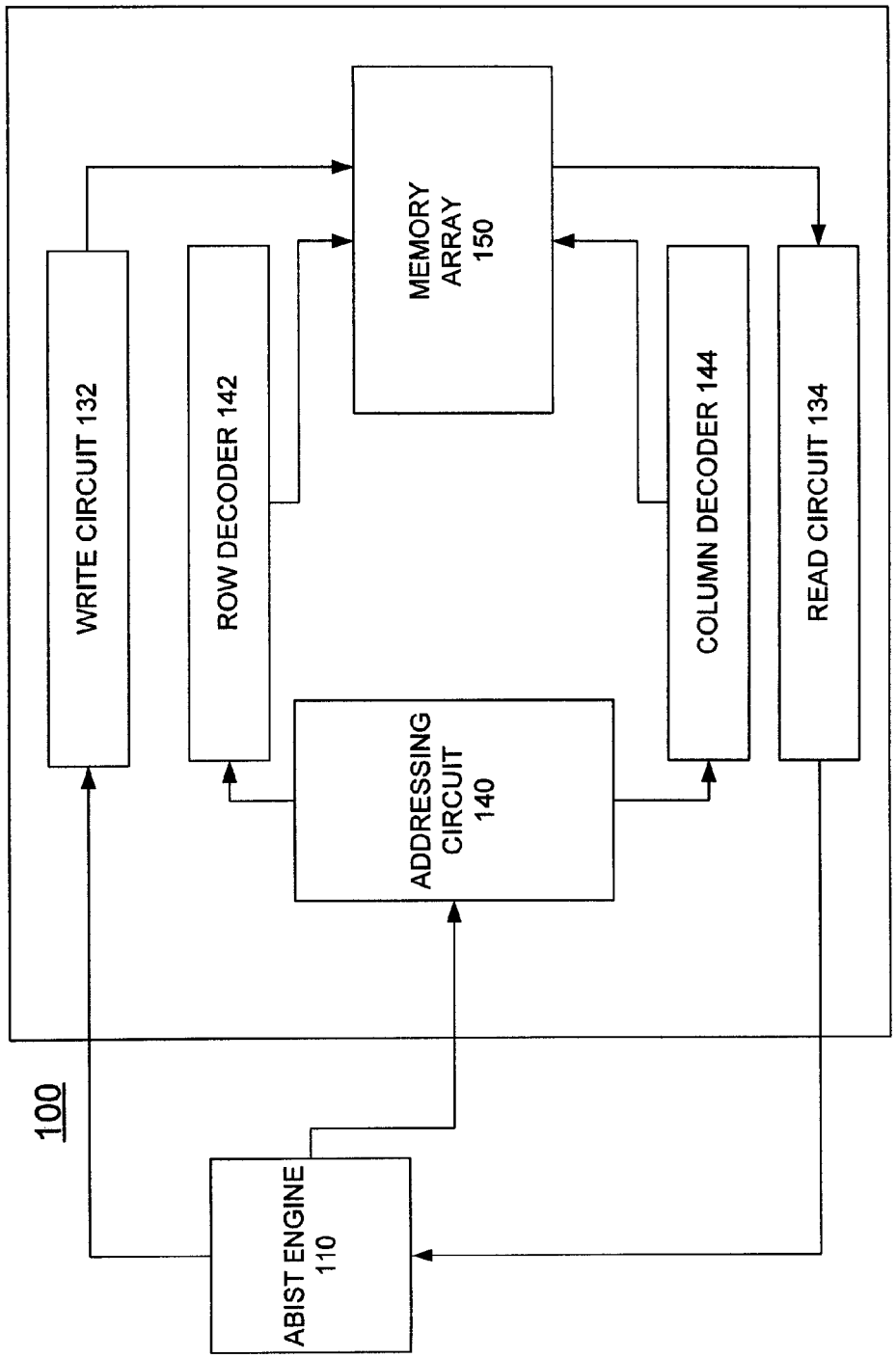
FIG. 1 is block diagram of an array macro in communication with an ABIST engine that is adaptable for use with one or more embodiments of the present invention.

FIG. 1 is block diagram of a circuit 100, including an array macro 120, in communication with an ABIST engine 110, that is operable for use with one or more embodiments of the present invention. Array macro 120 may include write circuit 132, read circuit 134, addressing circuit 140, row decoder 142, column decoder 142, and memory array 150.

In one or more embodiments, circuit 100 may write data to memory array 150, read data out of memory array 150, and compare the read data to expected values for the read data and establish a pass or fail condition for the test. In one or more embodiments, ABIST engine 110 may be a general or special purpose processor that may be operable to generate vector data ("write data") and/or address vectors (address values) for writing and/or reading data to/from array macro 120. ABIST engine 120 may also be operable to transmit one or more control signals to array macro 120 for controlling writing data thereto, reading data therefrom, and/or testing data therein.

In one or more embodiments, write circuit 132 may include one or more scannable latches and may be operable to receive data from ABIST engine 110 and re-transmit this data to memory array 150. In one or more embodiments, write circuit 132 may be commanded to write given data to memory array 150 without receiving the given data from ABIST engine 110. In such embodiments, the data may result from a "preset condition" activated by suitable control signal (s). Alternatively, the given data may be generated by write circuit 132. In one or more embodiments, read circuit 134 may also include one or more scannable latches and may be operable to receive data from memory array 150 and re-transmit this data to ABIST engine 110.

In one or more embodiments, addressing circuit 140 may receive address data from ABIST engine 110. Addressing circuit 140, may, upon receiving suitable control signal(s) from ABIST engine 110, or other device(s), transmit address data to row decoder (row decoder circuit) 142 and/or column decoder (column decoder circuit) 144, to either write data to, or read data from, memory array 150. Memory array 150 may include a grid of memory cells that are organized into rows and columns as is well known in the art.

In one or more embodiments, row decoder 142 and/or column decoder 144 may communicate with memory array 150 to identify a single memory cell, a plurality of memory cells, an entire row of cells, a plurality of rows of memory cells, an entire column of cells, and/or a plurality of columns of memory cells within memory array 150.

As discussed above, circuit 100 may write data to memory array 150, read data out of memory array 150, and compare the read data to expected values for the read data and establish a pass or fail condition for the test. More specifically, ABIST engine 110 may direct write data to write circuit 132 and address data to addressing circuit 140 and may cause write circuit 132, addressing circuit 140 and one or both of row decoder 142 and column decoder 144 to cause the write data to be stored at the address within memory array 150 indicated by the address data received at addressing circuit 140. This process may be repeated as many times as desired, thereby placing a plurality of sets of write data bits in a plurality of respective memory locations in memory array 150.

Either during or after the above-described writing of data to memory array 150, ABIST engine 110 may send address data to addressing circuit 140, accompanied by a suitable read control signal, to cause memory array 150 to transmit output data from memory array 150 to read circuit 134. Thereafter, the output data may be transmitted to ABIST engine 110 for comparison with expectation data. If the output data matches the expectation data, then the memory array 150 passes the test. If the output data does not match the expectation data, then memory array 150 fails the test.

In some embodiments, addressing circuit 140, write circuit 132, and read circuit 134 may each include a plurality of latches that are connected in series to form data-latch scan chains. Thus, in such embodiments, data from ABIST engine 110 is scanned in serially to the above-listed devices. Notably, such communication may require one clock pulse for every bit of data to be scanned into either of circuits 132 and 140 and to be scanned out of read circuit 134.

Data transmission within array macro 120 may occur more rapidly, using parallel connections between devices in communication with one another, which may require only a single clock cycle to transmit a plurality of data bits. Thus, the scanning of write data and address data that originates from ABIST engine 110 into write circuit 132 and addressing circuit 140, respectively, and the scanning of read data out of read circuit 134 may impose an upper limit on the operating frequency of the above-described testing process for memory array 150. This upper limit may operate to impede AC testing of memory array 150, that is, conducting testing at a sufficiently high frequency to test the dynamic response of the various circuits within memory array 150.

In one or more embodiments, the obstacles to conducting desired the desired testing of memory array 150, including AC testing, in circuit 100 may arise from the need to conduct extensive communication between ABIST engine 110 and array macro 120. While communication occurring within array macro 120 may be quite rapid, communication between array macro 120 and ABIST engine 110 may be much slower and may tend to limit the speed at which the testing of memory array 150 may be conducted.

Accordingly, superior testing performance may be obtained by locating test data generation and testing functionality within array macro 120 and by minimizing data communication bottlenecks imposed by serial communication between ABIST engine 110 and array macro 120. One or more embodiments incorporating one or more of the above-listed features are discussed in connection with the following figures.

Figure 2:
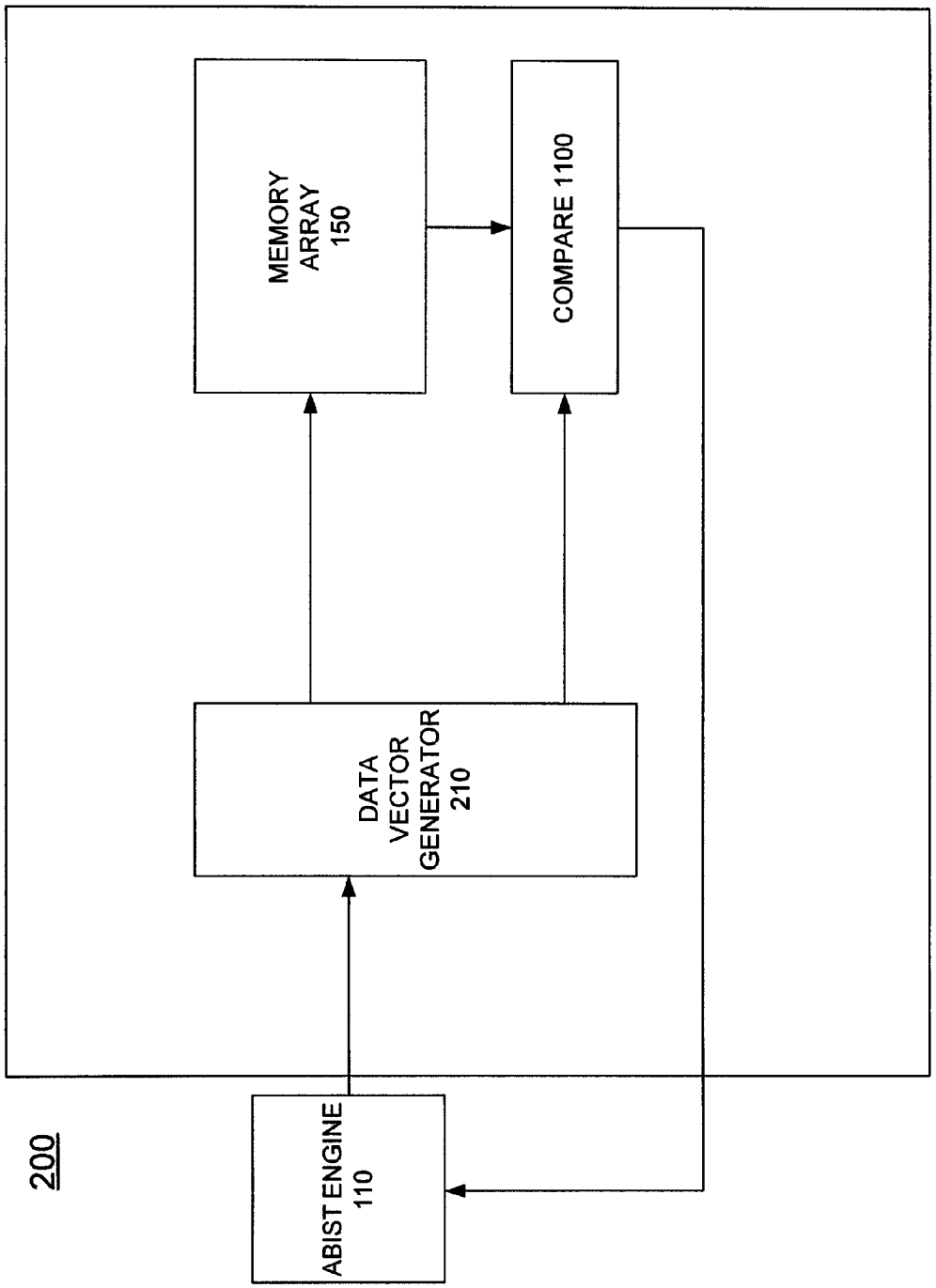
FIG. 2 is a block diagram of a circuit for testing a memory array in accordance with one or more embodiments of the present invention.

FIG. 2 is a block diagram of a circuit 200 for testing a memory array 150 in accordance with one or more embodiments of the present invention. Circuit 200 may include ABIST engine 110, vector data generator 210, memory array 150, and compare circuit 1100. ABIST engine 110 and memory array 150 have been previously described herein and those descriptions are therefore not repeated in this section.

In one or more embodiments, array macro 220 may be operable to rapidly generate data vectors, enable rapid communication between the sources and destinations of the data vectors, compare data vectors that have been exercised by being transmitted through memory array 150 with selected data values (which may be original data vector values) and provide a test result based on the comparison. In one or more embodiments, the foregoing may be accomplished without experiencing communication bottlenecks and without incurring a need to store mass quantities of vector data, address data, or comparison result data.

In one or more embodiments, the resulting testing speed may be sufficient to test the dynamic characteristics of memory array 150. In one or more embodiments, increasing the speed of the testing operation and enabling independence of the testing process from the operating speed of ABIST engine 110 may be enabled by applying one or more logical operations and/or algorithms, which may be implemented in hardware, to generate a plurality of successive data vectors for storage in memory array 150, and similarly employing algorithms, which may be hardware-implemented, to automatically and rapidly adjust the memory locations within memory array 150 that successive data vectors may be stored in.

In one or more embodiments, the one or more logical operations and/or algorithms may be applied recursively, that is, by using the output of each set of one or more logical operations as an input to a succeeding set of one or more logical operations. However, other approaches may be employed. In other embodiments, sources of data input to the one or more logical operations may be drawn from sources other than the result of a preceding set of one or more logical operations.

In one or more embodiments, rapid operation of the data reading and comparison portions of the memory array 150 testing process may be enabled in a similar manner. Specifically, a process, which may be implemented in hardware, and which may be used recursively, may be employed to rapidly read a succession of data vectors from a succession of memory locations in memory array 150. Moreover, one or more logical operations or algorithms, which may be hardware implemented, and which may be used recursively, may be employed to generate a succession of expectation data values (which may be original data vectors) to be compared with the succession of data vectors read from memory array 150.

A comparison circuit 1100 may be deployed to compare the plurality of successive read data vectors to the plurality of respective expectation data values to determine whether the memory array 150 passes of fails the test. Comparison circuit 1100 may be further operable to consolidate the test result (i.e. pass or fail) into a single bit, or other data configuration form amenable to communication to ABIST engine 110 within a single clock cycle. In this manner, the testing process described in greater detail below may be operable to test memory array 150 without experiencing data communication bottlenecks and without having to store mass quantities of vector data, address data, or comparison result data within array macro 220 or elsewhere.

In the following the operation of vector data generator 210 and memory array 150 is described, followed by a description of the operation of circuit 200 of FIG. 2 as a whole.

In one or more embodiments, data vector generator 210 may be operable to receive an initial data vector therein from ABIST engine 110. Data vector generator may then apply one or more logical operations on the initial data vector to generate a succession of data vectors. In one or more embodiments, the one or more logical operations may be applied recursively, wherein the output of each application of one or more logical operations may be used as an input to a succeeding application of the one or more logical operations. In this manner, in one or more embodiments, data vector generator 212 may be operable to generate a succession of data vectors each of which may differ from the data vector immediately preceding it and from the one immediately succeeding it. The output of data vector generator may be stored in memory array 150 and/or be compared to previously generated and stored data vectors in compare block 1100. Data vector generator 210 may be implemented using one or more circuits which may be within array macro 220.

In one or more embodiments, compare circuit 1100 may be operable to compare original data vectors received directly from vector data generator 210 with exercised versions of original data vectors that have been written to, and read from, or otherwise stated, "transmitted" through, memory array 150. Compare circuit may be further operable to output data indicative of one or more comparison results to ABIST engine 110 or other suitable control circuit.

In one or more embodiments, ABIST engine 110 may provide an initial data vector to data vector generator 210, thereafter, data vector generator may apply one or more logical operations to generate a succession of data vectors and transmit the data vectors to memory array 150 for storage therein. The stored data vectors may thereafter be further transmitted to compare block 1100. Herein, the data vectors that are stored in memory array 150 and subsequently transmitted to compare block 1100 may be referred to as exercised data vectors. Data vectors arriving at compare block directly from data vector generator 210 may be referred to herein as original data vectors.

In one or more embodiments, data vector generator 210 may be further operable to generate and transmit a succession of data vectors directly to compare block 1100. The ability of data vector generator 210 to transmit data vectors to both memory array 150 and compare block 1100 may be enabled by deploying two or more communication links emerging from data vector generator 210 and/or by deploying one or selectors and suitable control circuitry to selectively control the data flow of data vectors generated by data vector generator 210.

In one or more embodiments, compare block 1100 may compare a succession of exercised data vectors from memory array 150 with a succession of respective original data vectors that may be acquired directly from data vector generator 210 to determine whether the memory array 150 passes or fails the test.

The operation of one or more embodiments of circuit 200 is described in greater detail in connection with the following figures.

Figure 3:
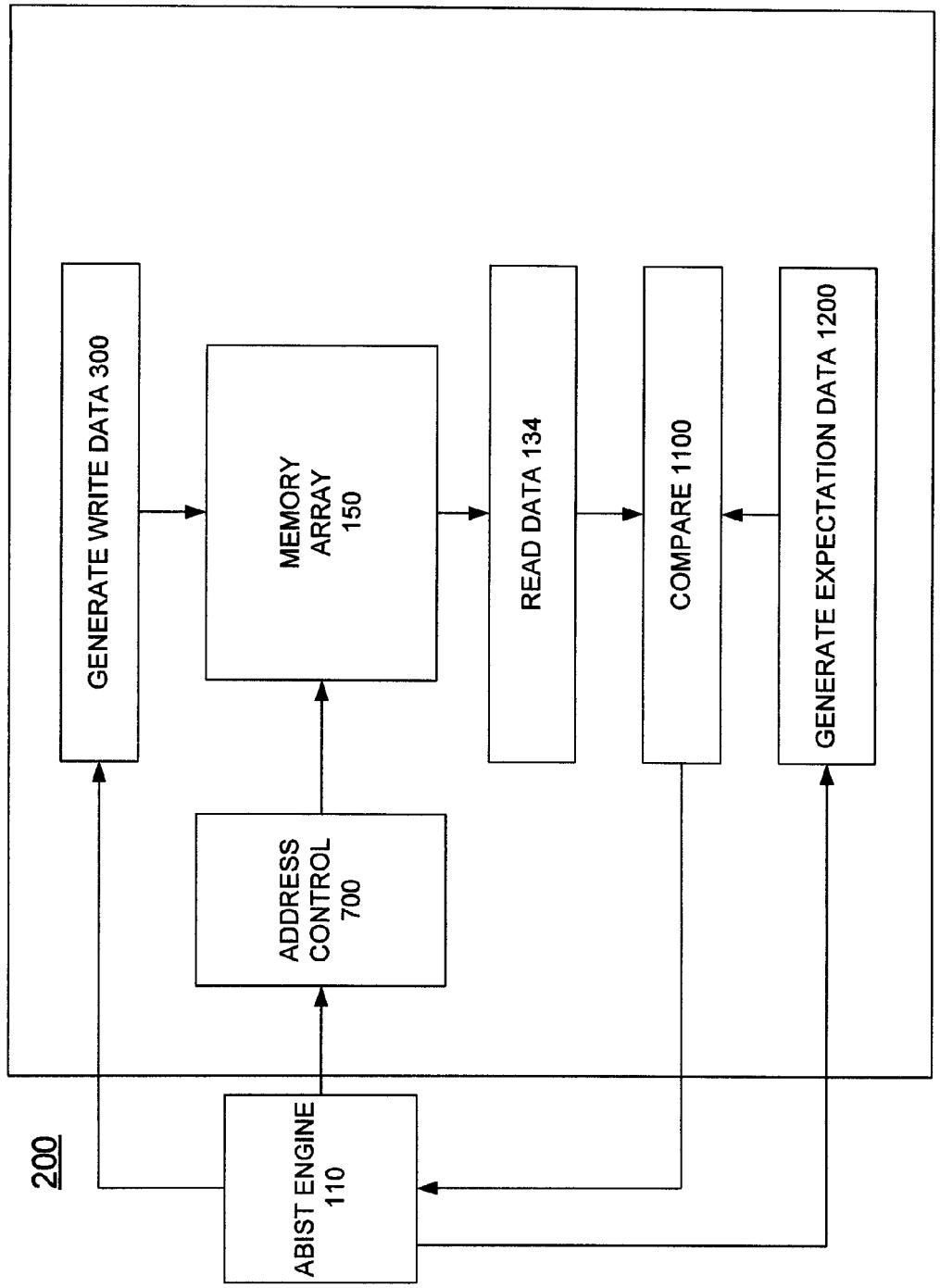
FIG. 3 is a block diagram of a circuit for testing a memory array in accordance with one or more embodiments of the present invention.

FIG. 3 is a block diagram of a circuit 200 for testing a memory array 150 in accordance with one or more embodiments of the present invention. Circuit 200 may include ABIST engine 110 and array macro 220. Array macro 220 may include write data generator 300, read circuit 234, address control 700, comparison circuit 1100, expectation data generator 1200, and memory array 150. The operation of data vector generator 210 of FIG. 2 may generally correspond to the operation of write data generator 300 and/or expectation data generator 1200 of FIG. 3. In the following, the various functional blocks of circuit 200 are introduced, after which the operation of circuit 200 as a whole is described. ABIST engine 110 and memory array 150 were described in connection with FIG. 1. Accordingly, those descriptions are not repeated in this section.

In one or more embodiments, write data generator 300 may be operable to generate data vectors (write data) that may change with each cycle of a clock signal input thereto. The succession of data vectors generated by write data generator 300 may begin with an initial data vector that may be read from ABIST engine 110. In one or more embodiments Write data generator 300 may include a series of data latches connected in series to form a scan chain, in which case the initial data vector may be scanned in to write data generator 300 from ABIST engine 110.

In one or more embodiments, during write operations, address control circuit 700 may be operable to direct successive data vectors from write data generator 300 to a succession of selected locations in memory array 150. During read operations, address control circuit 700 may be operable to direct data vectors from a succession of selected addresses in memory array 150 to read data circuit 134. The operation of one or more embodiments of address control circuit 700 is discussed in greater detail in connection with FIGS. 8-11.

Read data circuit 134 may be operable to receive data vectors from memory array 150 and/or to retransmit the data vectors for a comparison operation at compare circuit 1100. Read data circuit 134 may include two or more communication links. A first such link may be used for communicating directly with ABIST engine 110, as shown in FIG. 1, when array macro 220 is in a normal operating mode. A second communication link may be used to transmit data vectors to comparison circuit 1100 when array macro 220 is in a test mode. Selection of the suitable communication link emerging from read data circuit 134 may be implemented through the use of selector circuits and suitably implemented control circuitry.

In one or more embodiments, expectation data generator 1200 may be operable read in an initial expectation data value from ABIST engine 110 and to then generate a succession of data vectors that may change with each cycle of a clock signal input thereto. In one or more embodiments, the succession of expectation data values provided by expectation data generator 1200 may duplicate the succession of data vectors provided by write data generator 300. In one or more embodiments, expectation data generator 1200 may include a plurality of data latches connected in series to form a scan chain.

Compare block 1100 may be operable to compare data vectors from read data circuit 134 with expectation data values from expectation data generator circuit 1200 and output a result of the comparison to ABIST engine 110.

In one or more embodiments, ABIST engine 110 may scan an initial data vector into write data generator 300 and an initial address vector into address control circuit 700. The initial data vector may then be stored to the location in memory array 150 indicated by the initial address vector.

In one or more embodiments, write data generator 300 may perform one or more logical operations, starting with the initial data vector, to generate a succession of data vectors. In one or more embodiments, write data generator 300 may perform the one or more logical operations recursively, that is, by using the output of one application of the one or more logical operations as an input to a succeeding application of the one or more logical operations.

Similarly, address control circuit 700 may perform one or more logical operations, starting with the initial address vector, to generate a succession of address vectors. As with the generation of data vectors, discussed above, the address vectors may be generated recursively. While various algorithms and/or logical operations may be employed to generate the succession of address vectors, the succession of generated address vectors is preferably such as to not overwrite previously stored data vectors, until such previously stored data vectors have been fully tested within array macro 220.

In one or more embodiments, for each generated data vector and address vector, the circuitry of array macro 220 may cooperate to store each succeeding generated data vector in a memory array 150 location corresponding to a respective generated address vector. In this manner, a succession of data vectors may be stored in a succession of different memory locations within memory array 150.

For the sake of speed and simplicity, the generation of the data vectors and/or address vectors may be implemented in hardware which hardware may be incorporated within array macro 220. More specifically, in one or more embodiments, the generation of data vectors and address vectors may be implemented in hardware within write data generator 300 and address control circuit 700, respectively.

Attention is now directed to the lower portion of array macro 220 in which blocks 134, 1100, and 1200 are located. In one or more embodiments, to complete the testing of memory array 150 it may be desirable to unload, or read, the data vectors previously stored therein, compare the read data vectors to a suitable template, provide a result for the comparison of each vector pair (each grouping of one data vector and its corresponding expectation data value), and/or ultimately provide an overall pass or fail result for memory array 150.

In one or more embodiments, read data circuit 134 may read a first data vector from memory array 150, and ABIST engine 110 may provide an initial expectation data value to expectation data generator 1200. The first read data vector and the initial expectation data value may be compared in compare circuit 1100. An output indicative of the comparison result may then be output from comparison circuit 1100.

Thereafter, address control circuit 700 may operate to provide a succession of data vectors from memory array 150 to read data circuit 134 upon suitable input of read control signals and clock signals to address control 700. These data vectors may in turn be transmitted to compare circuit 1100. Similarly, starting with the initial expectation data value, expectation data generator 1200 may perform a succession of logical operations to generate a succession of expectation data values having a sequence corresponding to the succession of read data vectors. In one or more embodiments, the succession of logical operations may be performed recursively. In one or more embodiments, the succession of data vectors from read circuit 134 may be compared to the corresponding succession of expectation data values from expectation data generator 1200 in comparison circuit 1100. For each such comparison, comparison data may be generated and transmitted to ABIST engine 110. In one or more embodiments, the data indicative of the comparison of each vector pair may be consolidated into a single bit, or other data configuration suitable for transmission to ABIST engine 110 within a single clock cycle.

The above-described process may operate to beneficially avoid depending on the speed of communication links between ABIST engine 110 and array macro 220. The above process may also beneficially avoid any need for mass storage of write data or expectation data by generating each such type of data within array macro 220. Similarly, the consolidation of comparison data into a single bit may remove any need to store mass amounts of comparison data and/or to communicate any such mass amount of data to ABIST engine 110. Greater detail with regard to portions of circuit 200 of FIG. 3 is provided in the following figures.

Figure 4:
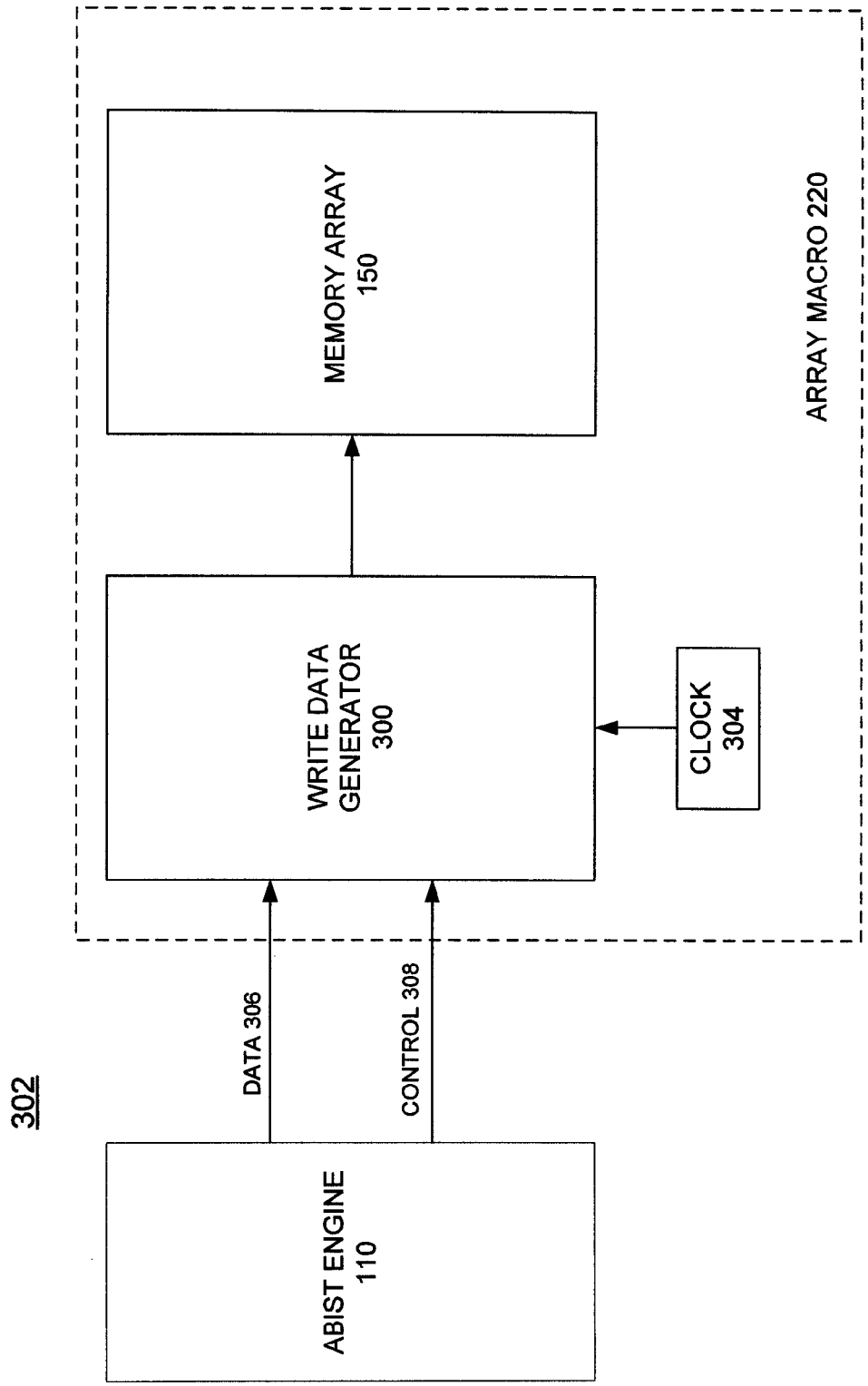
FIG. 4 is a more detailed illustration of a portion of the circuit of FIG. 3 which is operable to write data to a memory array, in accordance with one or more embodiments of the present invention.

FIG. 4 is a block diagram of the write data generator 300 of FIG. 3, in accordance with one or more embodiments of the present invention. Circuit 302 may include ABIST engine 110, write data generator 300, clock 304, and memory array 150. ABIST engine 110 and memory array 150 have been previously described herein, and those descriptions will not be repeated in this section. Clock 304 may be a digital clock suitably for periodically transmitting clock pulses, as is well known in the art. The operation of one or more embodiments of write data generator 300 is described in greater detail below.

In one or more embodiments, the structure and/or function of expectation data generator 1200 may duplicate that of write data generator 300. Thus, the following discussion of FIG. 4, the subsequent discussion of more specific embodiments of write data generator 300 in FIGS. 5-6, and the discussion of the signal timing in connection with FIG. 8 may apply to one or more embodiments of expectation data generator 1200 as well as write data generator 300. Accordingly, to avoid repetition and redundancy, the following detailed discussion of write data generator 300 is not repeated for expectation data generator 1200.

In one or more embodiments, ABIST engine 110 may provide data 306, employing suitable control signals 308, thereby establishing an initial data vector within write data generator 300. Write data generator 300 may then transmit the initial data vector to memory array 150. The initial data vector may be stored in a location in memory array 150 controlled by address control 700, the operation of which is discussed in greater detail in connection with FIG. 8.

In one or more embodiments, write data generator 300 may be operable to perform one or more logical operations on the initial data vector to generate a second data vector, upon receipt of suitable signal from clock 304. Upon receipt of suitable clock signal from clock 304, this subsequent data vector may then also be transmitted to memory array 150. In one or more embodiments, in subsequent operational cycles of write data generator 300, this process may be repeated as many times as desired, in each case using the result of one logical operation as an input to a succeeding logical operation, thereby enabling circuit 300 to generate an unlimited number of successive data vectors. In one or more embodiments, the one or more logical operations may be performed recursively, in which case, each data vector may differ from the data vector immediately preceding it and/or from the data vector immediately succeeding it in the succession of data vectors.

In one or more embodiments, a simple logical operation, or algorithm, for operating on the data vectors may be implemented to simplify and minimize the circuitry employed for implementation thereof. The following example employs recursive application of a logical operation to generate a succession of data vectors. However, it will be appreciated that the logical operation(s) employed to generate a succession of data vectors may, but need not, be applied recursively.

In this example, a toggling operation may be recursively employed to toggle one or more bits of a given data vector to generate a succeeding data vector. In this example, where an initial data vector is 1001, a portion of a succession of data vectors following the initial data vector may be as follows: 0110, 1001, 0110, 1001, etc. . . . One or more embodiments of a circuit for toggling successive data vectors may include the structure and operation shown in FIGS. 5-7 and discussed in connection therewith. It will be appreciated by those of ordinary skill in the art that other logical operations may be employed to generate a succession of data vectors, and all such variations are intended to be included within the scope of the present invention.

FIG. 5 is a schematic diagram of a circuit 400 suitable for implementing one or more embodiments of write data generator 300 of FIG. 4, in accordance with one or more embodiments of the present invention. FIG. 5 is a schematic diagram of a circuit 500 suitable for implementing one or more embodiments of one data latch of the write data generator embodiment 400 shown in FIG. 5.

Figure 6:
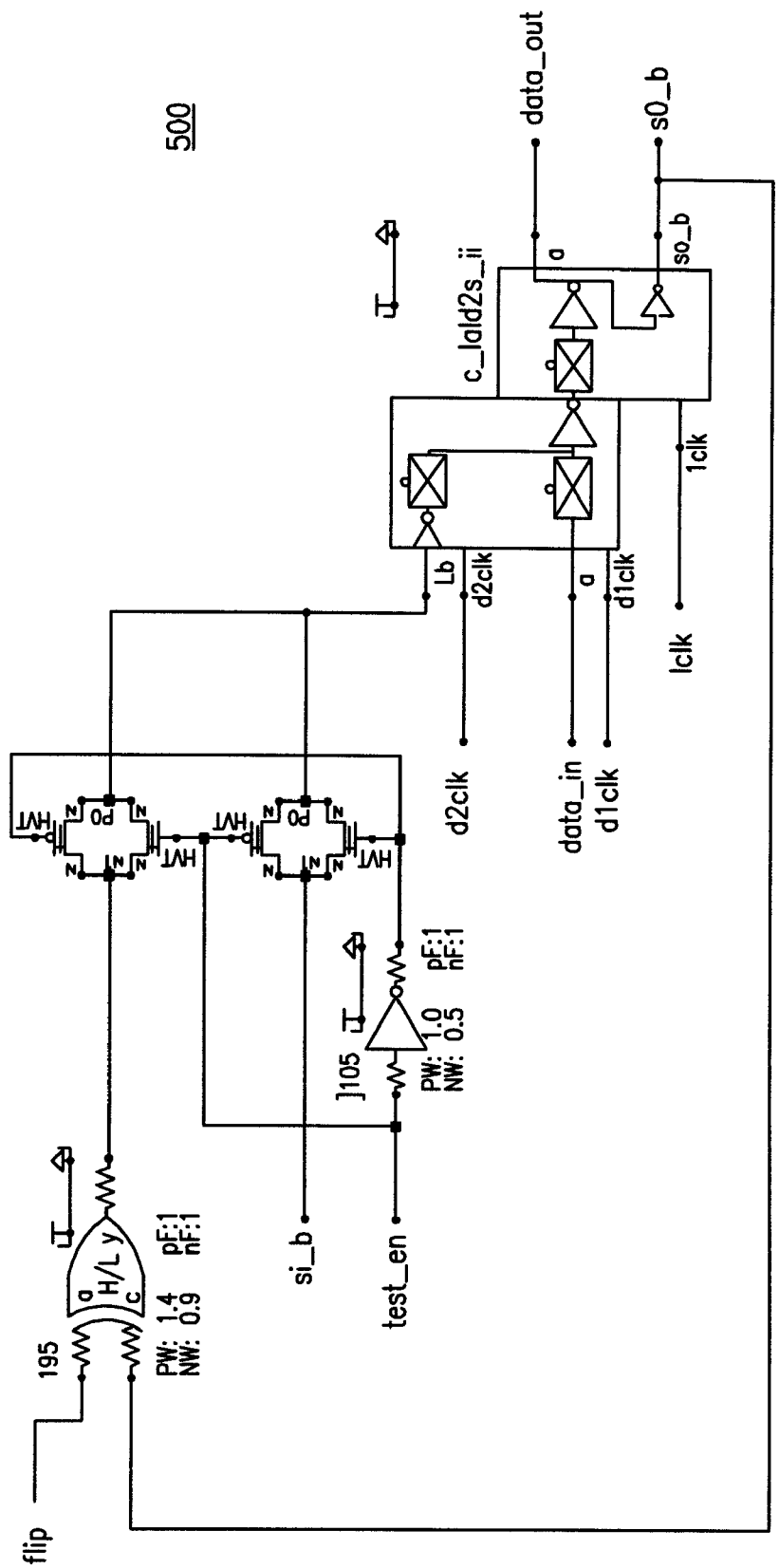
FIG. 6 is a schematic diagram of a circuit suitable for implementing one embodiment of one data latch of the write data generator embodiment shown in FIG. 5.
Figure 7:
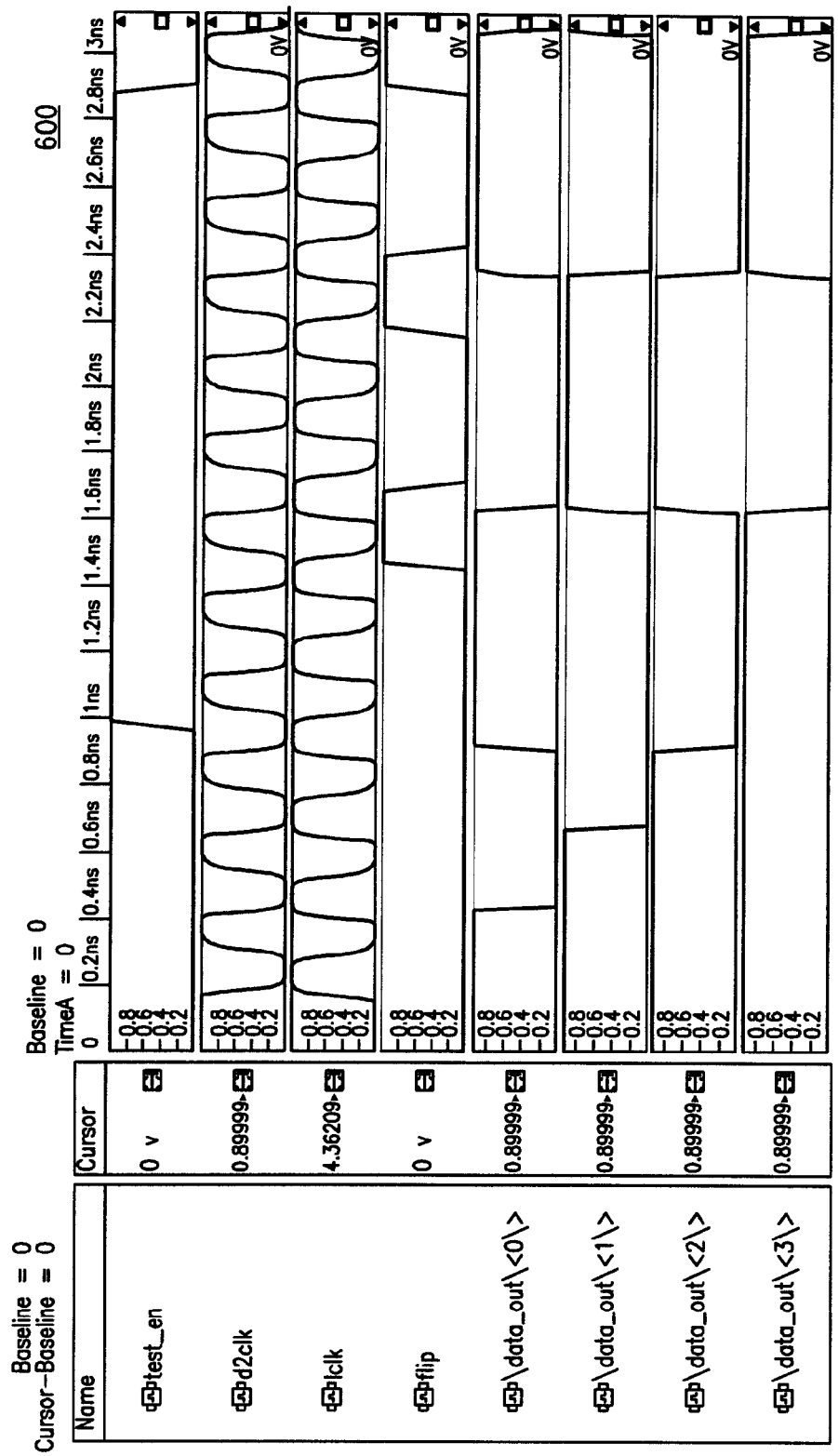
FIG. 7 is a timing chart showing the interaction of various signals associated with the operation of the circuits of FIGS. 5 and 6, in accordance with one or more embodiments of the present invention.

FIG. 7 is a timing chart 600 showing the interaction of various signals associated with the operation of the circuits of FIGS. 5 and 6, in accordance with one or more embodiments of the present invention. In the following, for the sake of convenience, the nomenclature of the "data_out" signal names has been simplified to "data_out_" followed by the appropriate numeral.

In one or more embodiments, the signals data_out_0 data_out_1, data_out_2, data_out_3 are the respective output values of the four latches, in top to bottom order, shown in FIG. 5 and may combine to form a four-bit data vector. In this data vector, add_out_3 may be the highest-order bit, and add_out_0, the lowest-order bit.

At the left of chart 600, the data vector output may be initialized to the value 1001 by the test enable signal at about T=1 ns (nanosecond). (Time T is shown along the top of chart 600). This data vector value may be maintained between about T=1 ns and about T=1.5 ns. In response to the "flip" signal being activated, the data vector bits, and the data vector as a whole, may be toggled to the value 0110, which value is active between about T=1.5 ns and about T=2.3 ns. Thereafter, the data vector may toggle between the values 1001 and 0110 with each activation of the "flip" signal. It may be seen that the "flip" signal toggles once for every third cycle of the d2clk and 1clk clock signals. However, it will be appreciated by those of skill in the art that other activation frequencies of the flip signal may be selected.

Figure 8:
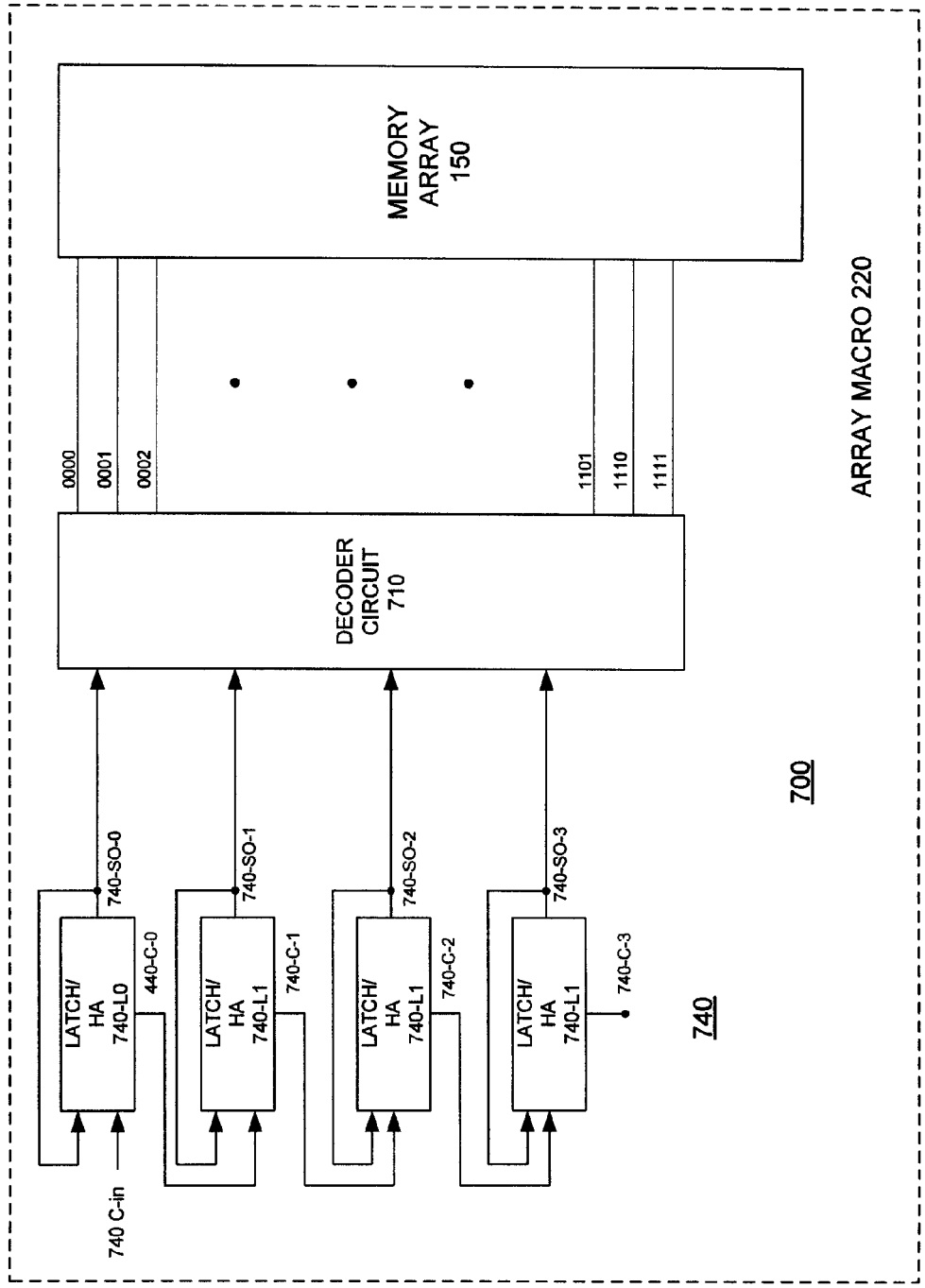
FIG. 8 is a block diagram of an implementation of the address control circuit of FIG. 3 in accordance with one or more embodiments of the present invention.

FIG. 8 is a block diagram of an implementation of the address control circuit 700 of FIG. 2 in accordance with one or more embodiments of the present invention.

Circuit 702 may include a portion of array macro 220 which may in turn include data-latch scan chain 740, decoder circuit 710 (which together may correspond to address control 700 of FIG. 2) and memory array 150. Circuit 702 may be operable to provide an automatically incrementing set of address values from scan chain 740 to memory array 150 to enable rapidly accessing plurality of successive storage locations within memory array 150. While the following discussion describes one approach to automatically changing address vectors designating memory locations in memory array 150 to which successive data vectors may be written, it will be appreciated that address control circuit 700 may be operable to implement various algorithms other than address vector incrementing, and all such variations are intended to be included within the scope of the present invention.

In one or more embodiments, a binary word formed by the outputs of the latches of scan chain 740 may be incremented by a value of 1 for each clock cycle of scan chain 740. In one or more embodiments, one clock pulse may be employed to trigger the incrementing function, and another clock pulse may be employed for the normal operation of each of the latches. In one or more other embodiments, the binary word output of scan chain 740 may be incremented by values greater than one for each clock pulse.

In one or more alternative embodiments, one or more arithmetic and/or logical operations in place of or in addition to the above-described incrementing function may be implemented. Such operations may include but are not limited to decrementing by values of one or more, multiplying or dividing the binary word output of scan chain 740 by a specified value, among other arithmetic and/or logical operations.

Data-latch scan chain 740 may include a plurality of data latches 740-L0 to 740-L3 and suitable connections disposed between the latches. While four latches are shown within data-latch scan chain 740, fewer or more than four latches may be deployed within scan chain 740. In one or more embodiments, the connections between latches 740-L0 to 740-L3 that form scan chain 740 may be permanently hard-wired into scan chain 740. However, in one or more alternative embodiments, the test mode wiring connections between the latches may be selectively implemented during a test mode of the latches of scan chain 740 and selectively removed during a normal mode function thereof. A combination of control circuitry and selectors may be suitably deployed to implement the above-described wiring connections for latches 740-L0 to 740-L3.

In the following, the reference numeral "740-L" refers to any one of the four latches shown in data-latch scan chain 740. In one or more embodiments, data latch 740-L may include circuitry corresponding to a conventional flip-flop circuit and at least one circuit for performing an arithmetic operation and/or logical operation on the contents of that latch and/or on data drawn from latch 740-L and one or more other sources.

In one or more embodiments including that shown in FIG. 7, latch 740-L may include a conventional flip-flop circuit and an adder circuit, which may be a half-adder circuit, in communication therewith. In one or more embodiments, the adder circuit may be incorporated within latch 740-L.

The half-adder circuit may receive two inputs and provide two outputs: a "sum" bit and a "carry" bit. In such embodiments, the sum output may serve as the output for that latch and may also serve as one of the inputs for the half-adder circuit of that latch. The carry output of each latch may serve as an input to an adjacent latch, which may be one bit higher in a bit-order rank of the latches within scan chain 740. In this embodiment, the "carry" input to latch 740-L0 (for which there is no lower bit order latch to provide a "carry" output), labeled "440 C-in," may be kept high at all times.

In other alternative embodiments, apparatus for performing the arithmetic operation need not be incorporated within each latch 740-L. Instead, arithmetic and/or logical operation circuitry may be in communication with, but deployed separately from, latches 740-L0 through 740-L3.

Decoder circuit 710 may operate to decode address vectors (address values) in which a binary word received at an input to decoder circuit 710 may be decoded so as to activate a selected output pin among a plurality of output pins extending from decoder circuit 710. The function of decoder circuit 710 within circuit 702 is described below. Memory array 150 has been described earlier herein, and that description is therefore not repeated in this section.

In one or more embodiments, an initial address value (address vector) may be scanned into scan chain 740 from a device external to array macro 150, such as ABIST engine 110 or other data source. A control signal may then be applied to the latches of scan chain 740 to initiate a test of memory array 150. The control signal may be provided by ABIST engine 110 (FIGS. 1-4) or other suitable control circuitry.

For the sake of illustration, the following discussion is directed to an embodiment in which the address values in scan chain 740 are incremented to provide a series of data writing operations to memory array 150.

The following discussion is directed to the coordination of a memory address designation signal with a write control signal. It may be readily seen by those of skill in the art that the memory address designation provided by scan chain 740 to decoder 710 and then transmitted to memory array 150 in decoded form may be coordinated with a "read control signal" in a manner analogous to the coordination between a write control signal and the memory location designation corresponding thereto, described below. Accordingly, a detailed discussion of a "read" operation is not provided in this section.

In one or more embodiments, an initial address value (address vector) may be transmitted to decoder circuit 710, which may in turn, activate an output pin, the number of which may correspond to the address value transmitted from scan chain 740. The activated output pin may then designate a destination within memory array 150 to which write data (one or more data vectors) may be transmitted. ABIST engine 110 or other suitable control circuitry may then transmit a "write" control signal to trigger the transmission of write data to the designated location within memory array 150. Suitable synchronization of the write control signal with the memory location activation signal may be provided by ABIST engine 110 or other suitable control circuitry.

In one or more embodiments, upon receiving suitable clock signal input, the incrementing function of scan chain 740 may be activated, and the result of the incrementing operation may be latched at the outputs of the latches of scan chain 740. This latched output is effectively an updated address vector, or address value, that is "stored" in latches 440-L through 440-L3.

In one or more embodiments, the processes of incrementing, storing, and transmitting address vectors, described herein, may be repeated until the initial address value stored, or latched, at the latch outputs of scan chain 440 has been incremented to a maximum storable value, such as "1111" (in the simplified case of a four-bit output), or to some other selected binary-word output value. Alternatively, other conditions may be employed to bring the incrementing process to a halt, including but not limited to: a control signal indicative of test conclusion, a fault condition, and/or one or more other termination conditions.

To illustrate the operation of one or more embodiments of the present invention, an example is considered below in which "write data" is written to a plurality of memory array 150 addresses indicated by successive outputs from scan chain 740. The example begins with the address vector "0000" being scanned into scan chain 740. While not shown in FIG. 8, a write circuit, such as write data generator 300 of FIG. 3, may have an initial data vector provided thereto. The write circuit 300 may also include a data-latch scan chain, but alternatively may include any type of circuit suitable for rapidly writing a data vector to a designated location within memory array 150. The write circuit 300 may also have circuitry incorporated therein, or which is in communication therewith, that may perform logical and/or arithmetic operations on a data vector stored therein to continuously modify the data vector with each successive clock cycle.

While the below example is directed to four-bit data vectors at address locations defined by four-bit address vectors, it will be appreciated that the concepts illustrated in the example are applicable to data vectors of any size and address vectors of any size. Moreover, while the above example incorporates a continuously changing data vector, the following exemplary test may be conducted without so modifying the data vector. In this case, and repeating a portion of the conditions of the above example, the same data vector may be written to memory locations "0000" through "1111". This constant data vector, however, could have any value between "0000" and "1111", when operating within the stated constraint of data vectors being four bits long.

For the sake of this example, the initial data vector value is set to "0000". Thus, upon receiving a suitable clock signal, the data vector "0000" may be written to memory location "0000" of memory array 150. Continuing with the example, as described above, the address vector may increment to "0001". The data vector in write data generator 300 may be toggled, undergo another logical operation, or alternatively, may remain the same for subsequent write operations. Assuming that the data vector is toggled for each successive write operation, the data vector 0000 may be written to every second memory array 150 location (every even-numbered memory location), and the data vector 1111 may be written to every second memory array 150 location (every odd-numbered memory location). To illustrate this pattern, the contents of the lowest-numbered four memory locations applying this example are presented below:

| Memory location Number | Stored Data Vector |
| --- | --- |
| 0000 | 0000 |
| 0001 | 1111 |
| 0010 | 0000 |
| 0011 | 1111 |

Notably, one or more embodiments including that shown in FIG. 8, are able to rapidly generate and transmit address data that may change with each succeeding clock cycle, thereby enabling an entirety or a selected portion of memory array 150 to be filled with a plurality of data vectors (write data) that are stored at a plurality of respective memory locations without requiring communication of data vectors or address vectors from ABIST engine 110 beyond that associated with providing one initial data vector and one initial address vector.

The embodiment of FIG. 7 is directed to the use of four-bit address vectors, in which the time savings over existing systems that scan new addresses in for each write operation is significant. However, It may be seen that such time savings may increase dramatically where the address vectors are 128 bits long or longer.

FIG. 9 is schematic diagram of a circuit 800 suitable for implementing one or more embodiments of the scan chain 740 discussed in connection with FIG. 8, in accordance with one or more embodiments of the present invention.

Figure 10:
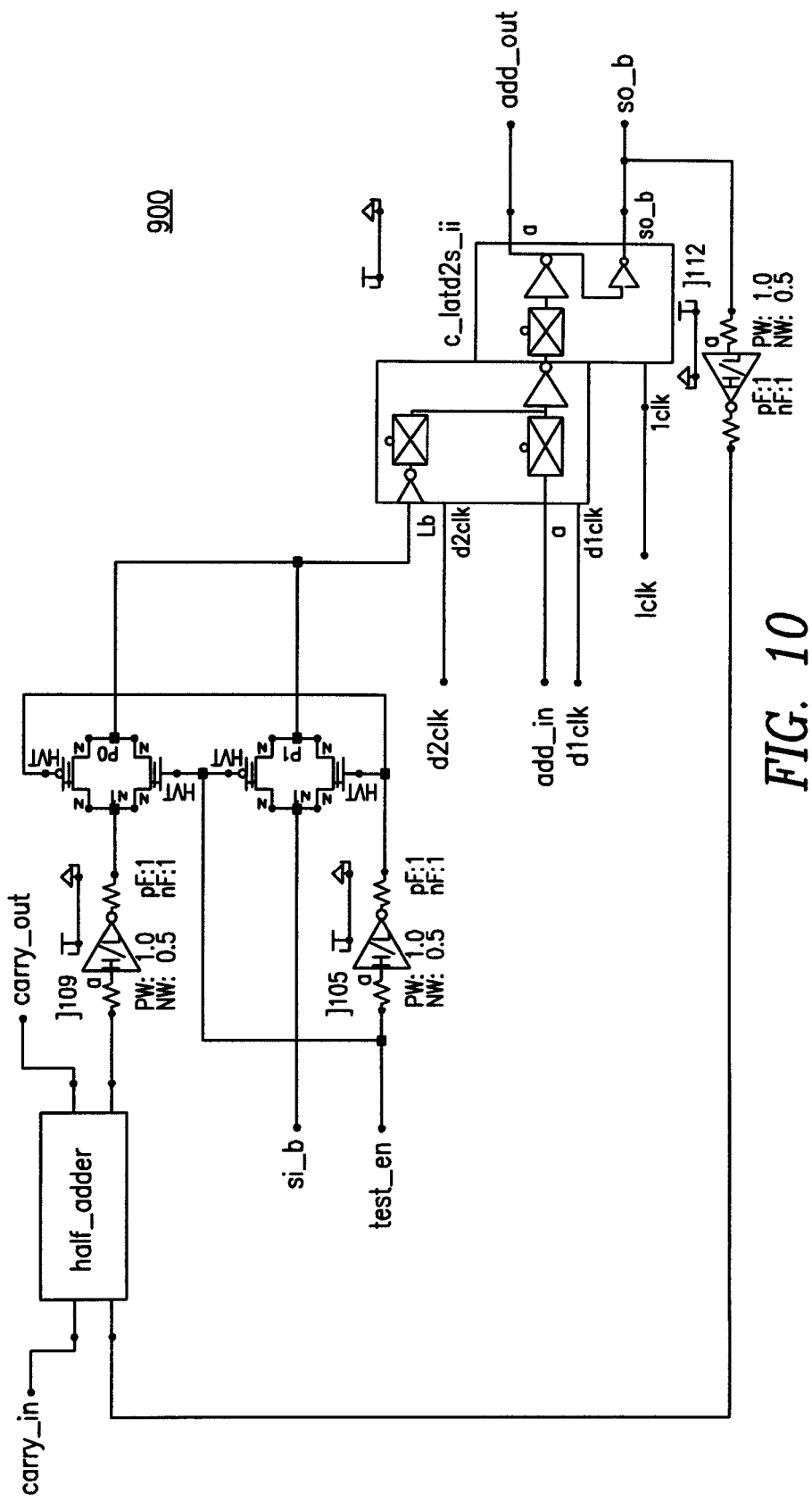
FIG. 10 is a schematic diagram of a circuit suitable for implementing a portion of the circuit of FIG. 8, in accordance with one or more embodiments of the present invention.

FIG. 10 is a schematic diagram of a circuit 900 suitable for implementing one data latch of scan chain 740 discussed in connection with FIG. 8, in accordance with one or more embodiments of the present invention.

Figure 11:
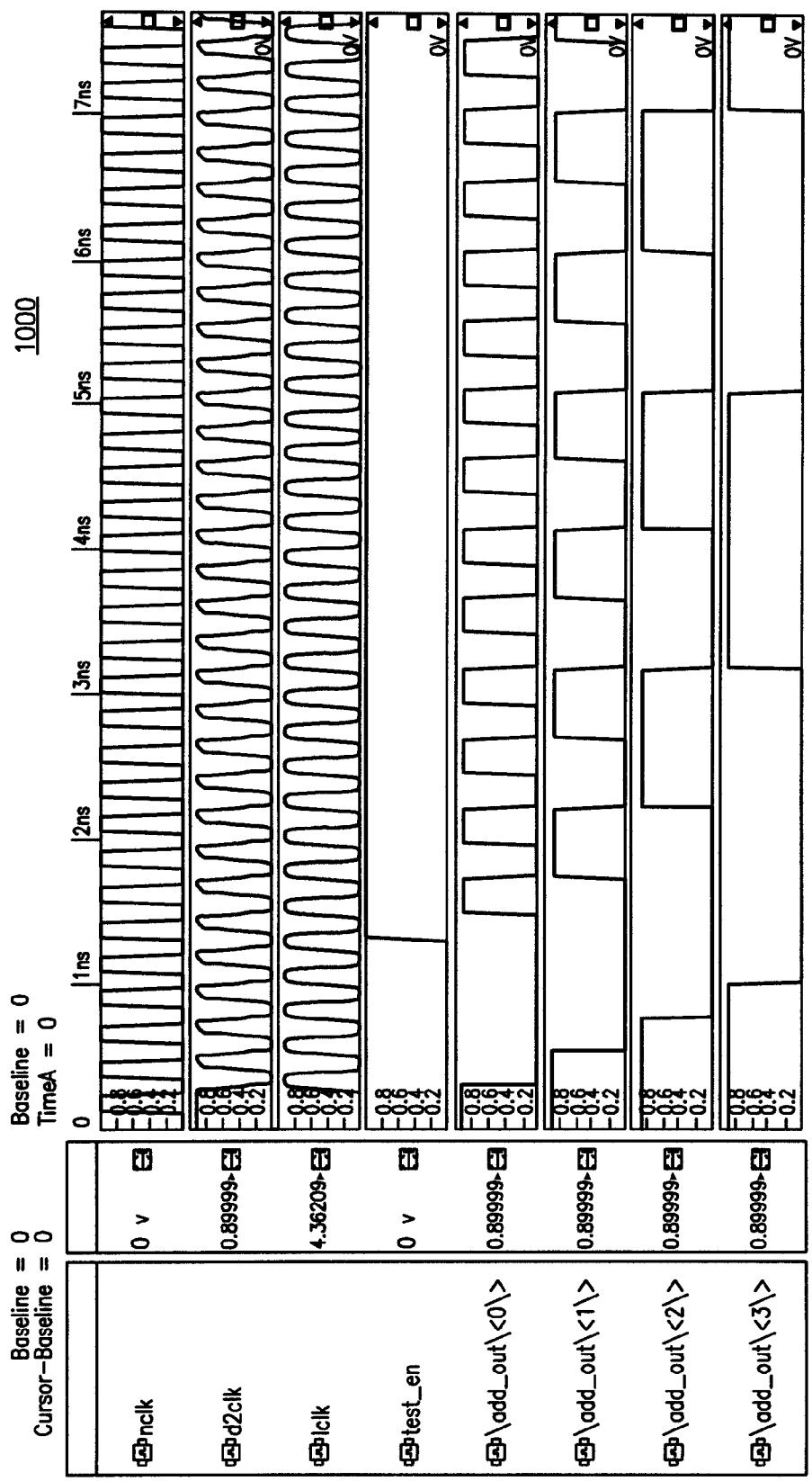
FIG. 11 is a timing chart showing the interaction of various signals associated with the operation of the circuits of FIGS. 9 and 10, in accordance with one or more embodiments of the present invention.

FIG. 11 is a timing chart 1000 showing the interaction of various signals associated with the operation of the circuits of FIGS. 8 and 9, in accordance with one or more embodiments of the present invention. In the following, for the sake of convenience, the nomenclature of the "add_out" signal names has been simplified to "add_out_" followed by the appropriate numeral.

In one or more embodiments, signals add_out_0, add_out_1, add_out_2, add_out_3, may correspond to the output values of latches 740-L0, 740-L1, 740-L2, and 740-L3, respectively. At the left of the chart 1000, the four signals are initialized to 0 in a step-wise manner. The signals remain at 0 until the test enable signal "test_en" is activated. Thereafter, the four signals begin changing in accordance with the above-described operation of the scan chain 740 output of circuit 702. More specifically, the binary word formed by the four signals, when suitably ordered according to their respective bit-order ranks, begins incrementing from 0000, to 0001, all the way up to 1111. Thereafter, shortly after the "5 ns" (5 nanosecond) point shown along the top of chart 1000, the values of all four outputs may drop to 0 again, as expected.

Figure 12:
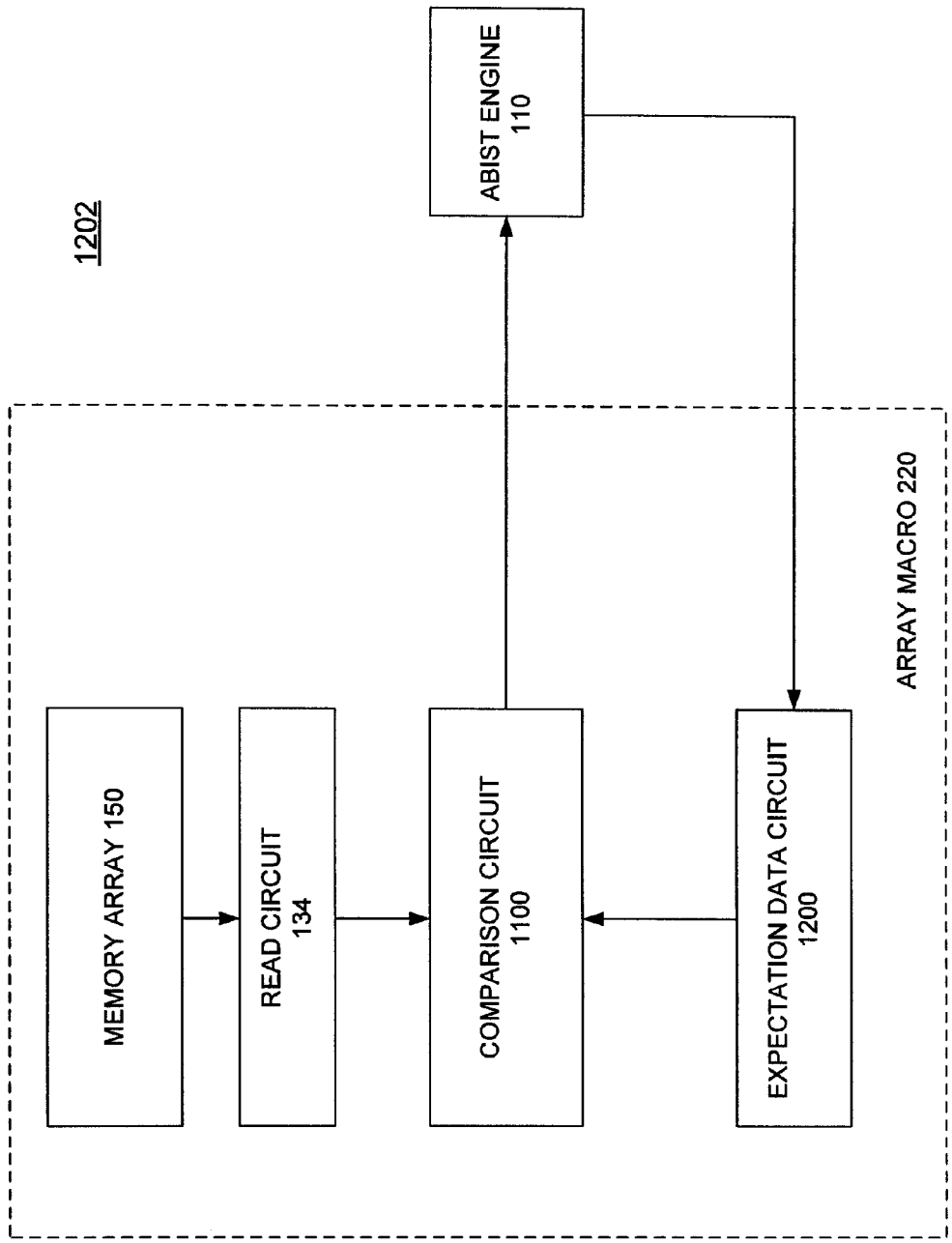
FIG. 12 is a block diagram of a portion of the circuit shown in FIG. 3, which is adaptable to compare read data vectors with expectation data values in accordance with one or more embodiments of the present invention.

FIG. 12 is a block diagram of a portion 1202 of circuit 200 of FIG. 3 adaptable to compare read data vectors with expectation data values in accordance with one or more embodiments of the present invention. Circuit 1202 may include memory array 150, read circuit 134, comparison circuit 1100, expectation data circuit 1200 (also referred to herein as expectation data generator 1200), and ABIST engine 110. The listed functional blocks of circuit 1102 have been previously described herein. Accordingly, those descriptions are not repeated in this section.

In one or more embodiments, circuit 1102 may be operable to compare a succession of data vectors from read circuit 134 with a corresponding succession of expectation data values from expectation data circuit 1200 and to determine whether the memory array 150 passes or fails based on the comparing step.

In one or more embodiments, read circuit 134 may read one data vector from memory array 150 and pass this data vector on to circuit 1100 for comparison, before reading a succeeding data vector from memory array 150. Likewise, in one or more embodiments, expectation data circuit 1200 may transmit either an initial or self-generated data value to comparison circuit 1100 before generating a succeeding data value. In this manner, the need for buffering or storing a sequence of data vectors and/or expectation data values for read circuit and expectation data circuit 1200, respectively, may be avoided. However, in one or more alternative embodiments, memories could be deployed to store a sequence of data vectors from read circuit 134 and/or a sequence of expectation data values from expectation data circuit 1200 for subsequent transmission to comparison circuit 1100.

In one or more embodiments, read data circuit 134 may receive a data vector from memory array 150 and transmit the data vector to comparison circuit 1100. Expectation data circuit 1200 may receive an initial expectation data value from ABIST engine 110 and transmit this initial expectation data value to comparison circuit 1100. Comparison circuit 1100 may perform at least one logical operation using the received data vector and the received initial expectation data value (which together form a "vector pair") as inputs and provide an output indicative of a pass or fail condition for that vector-pair comparison operation and/or for memory array 150 as a whole.

In one or more embodiments, the operation(s) for comparing a data vector to its corresponding expectation data value may include comparing each bit of the data vector to the bit of corresponding bit order in the corresponding expectation value. Thus, in such embodiments, the comparison of a data vector to its corresponding expectation data value may represent an accumulation of the results of comparisons of the respective data bits of the data vector and the expectation data value. However, in one or more other embodiments, other approaches may be employed.

In one or more embodiments, comparison circuit 1100 may be operable to consolidate the result of a comparison of a single vector pair into data suitable for transmission to ABIST engine 110 within a single clock cycle. In one or more embodiments, comparison circuit 1100 may be operable to consolidate the result of a comparison of a single vector pair into a single bit, within array macro 220. In this manner, the need for buffering significant quantities of comparison result data may be avoided. Moreover, the communication of each comparison result may be communicated to ABIST engine 110 within a single clock cycle, thereby preventing the communication of comparison results to ABIST engine 110 from imposing a bottleneck, or upper limit, on the operation of array macro 220.

Attention is now directed to the interplay between the or one or more logical operations performed in expectation data circuit 1200 to generate a succession of expectation data values and the one or more logical operations performed in comparison circuit 1100. It will be appreciated that a range of operations could be performed within expectation data circuit 1200 and within comparison circuit 1100 the combination of which may yield an effective comparison of the data vectors originally written to memory array 150 and the data vectors later read out of memory array 150 to read circuit 134. In the following, various possible combinations of operations within circuits 1200 and 1100 are discussed.

In one or more embodiments, the initial expectation data value may correspond identically to the initial data vector provided to write data generator 300. Similarly, expectation data circuit 1200 may perform the same logical operation(s) on the initial expectation data value, and on subsequently generated data values that write data generator 300 performs on its initial data vector and on subsequently generated data vectors, respectively.

In one or more embodiments, expectation data circuit 1200 may perform the logical operation of toggling at least one bit of each expectation data value to generate a succeeding expectation data value. In one or more such embodiments, expectation data circuit 1200 may toggle all the bits of each expectation data value to generate the next or succeeding expectation data value. Thus, in one or more embodiments, each of a succession of expectation data values may be the same as each one a succession of corresponding data vectors generated by write data generator 300.

In one or more embodiments in which the expectation values are generated so as to duplicate the values of the data vectors initially provided to memory array 150 from write data generator 300, comparison circuit 300 may be operable to determine whether the data vector and expectation data value within each vector pair are identical. Where such identity is found, comparison circuit 1100 may provide an output signal indicative of a pass condition for that vector pair to ABIST engine 110. Where identity is found to be lacking, comparison circuit 1100 may provide an output signal indicative of a fail condition for that vector pair to ABIST engine 110. Where identity is found for an entire succession of vector pairs transmitted to comparison circuit 1100 for comparison, one or more of comparison circuit 1100, ABIST engine 110, or other suitable circuit may establish a pass condition for memory array 150. Where one or more of a succession of vector pair comparisons indicates a lack of identity, one or more of comparison circuit 1100, ABIST engine 110, or other suitable circuit may indicate a fail condition for memory array 150. In other words, in or more embodiments, if even one comparison of a data vector to its corresponding expectation data value indicates a lack of identity therebetween, the test may indicate a fail condition for memory array 150.

In one or more alternative embodiments, expectation data circuit 1200 need not be configured to generate expectation values that are identical to those generated by write data generator 300. Instead, circuit 1200 may be configured to generate data values that correspond to the data vectors generated by write data generator 300 after having one or more logical operations performed thereon. In this situation, the logical operation(s) performed on each vector pair by comparison circuit 1100 and the meaning attributed to the results of such operation(s) may be adjusted in accordance with the manner in which the expectation data values may be modified with respect to the data vectors generated by write data generator 300.

For example, in one or more embodiments, expectation data circuit 1200 may generate a succession of expectation data values that are the complements of the data vectors originally provided to memory array 150 by write data generator 300. In this case, where the data vector and the expectation data value of a vector pair are found to be complements of one another, comparison circuit 1100 may generate output data indicative of pass condition for that vector pair.

It will be apparent to those of ordinary skill in the art that other modifications to the data vectors provided to memory array 150 by write data generator 300 may be generated by expectation data circuit 1200. In such embodiments, comparison circuit 1100 may be suitably modified to properly determine a pass or fail condition upon comparing vector pairs generated in accordance with such embodiments.

Figure 13:
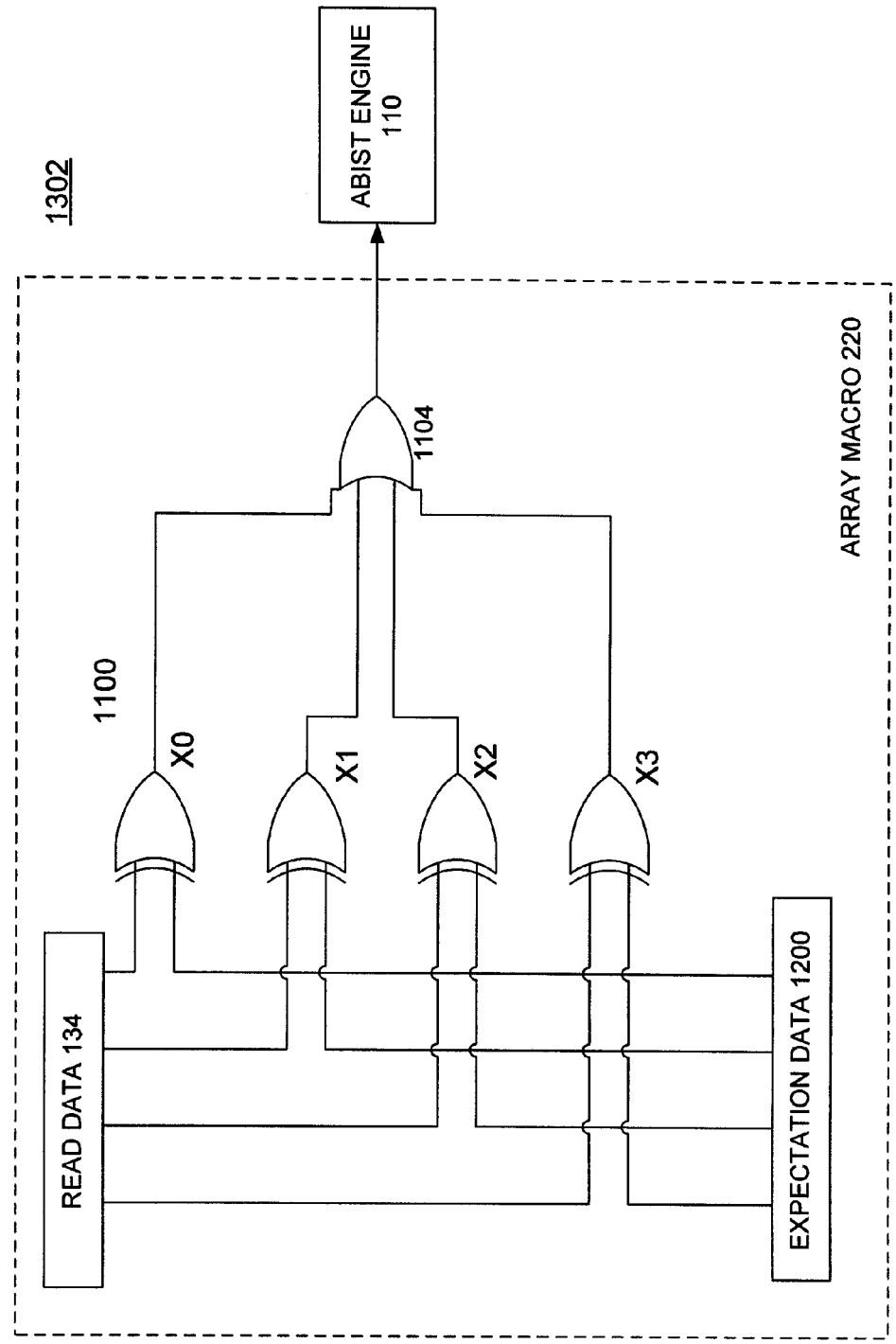
FIG. 13 is a block diagram showing the comparison circuit of FIG. 12 in greater detail, in accordance with one or more embodiments of the present invention.

FIG. 13 is a block diagram of circuit 1302 showing the comparison circuit 1100 of FIG. 11 in greater detail, in accordance with one or more embodiments of the present invention. Circuit 1202 may include read data circuit 134, expectation data circuit 1200, ABIST engine 110, and comparison circuit 1100 which may in turn include XOR gates X0, X1, X2, and X3, and OR gate 1104.

In one or more embodiments, circuit 1202 may be operable to compare data vectors from read data circuit 134 and expectation data values from expectation data circuit 1200, consolidate the comparison result into a single bit, and transmit the result to ABIST engine 110.

Read data circuit 134, expectation data circuit 1200, and ABIST engine 110 have been previously described herein. Accordingly, those descriptions will not be repeated in this section. The structure and operation of XOR gates X0 through X4 and OR gate 1104 are known in the art and will therefore not be discussed in detail herein.

In one or more embodiments including that shown in FIG. 13, the expectation data values transmitted to comparison circuit 1100 may be either the same as, or the complement of, the data vectors originally written to memory array 150 by write data generator 300. The following discussion is directed to one or more embodiments in which the expectation data values may be the same as the data vectors generated by write data generator 300. It will be appreciated that the function of circuit 1302 may be provided by various combinations of digital logic gates other than those shown in FIG. 13. Moreover, while FIG. 13 is directed to an embodiment in which four bits from each data vector and each expectation data value are compared, it will be appreciated that fewer or more than four bits may be included in each data vector and/or each expectation data value, and all variations are intended to be included within the scope of the present invention.

In one or more embodiments, the low through high order bits of data vectors from read data circuit 134 and expectation data values from expectation data circuit 1200, may be directed to XOR gates X0, X1, X2, and X3, respectively, as shown in FIG. 13. Each XOR gate in comparison circuit 1100 may be low if the two inputs are the same, that is, either both logic-0 (low) or both logic-1 (high). Therefore, where all the sets of bits of the data vector and the expectation data value being compared are the same, the outputs of all four XOR gates may be logic-0. These low output values may in turn cause OR gate 1104 to output a logic-0 value to ABIST engine 110. Accordingly, ABIST engine 110 may interpret the receipt of a logic-0 value from OR gate 1104 of array macro 220 as indicative of a match, or successful comparison, between one data vector and one expectation data value.

It is noted that if any of the XOR gate outputs is high, which would be indicative of a mismatch between at least one bit pair comparison, the output of OR gate 1104 may be logic-1 (high). In this case, ABIST engine 110 may interpret the logic-1 value as indicative of a mismatch between a data vector and an expectation data value.

In one or more embodiments, comparison circuit 1100 may transmit one output bit for each cycle of a clock signal input to array macro 220 and for each vector pair comparison occurring within array macro 220. When one complete test of memory array 150 has been completed, which completion may be indicated by the completion of a specified number of vector pair comparisons, ABIST engine 110 may determine whether array macro 150 has passed or failed the test. In this embodiment, a pass condition may be accorded to memory array 150 if all of the vector pair comparisons yielded logic-0 outputs from OR gate 1104 to ABIST engine 110. Conversely, the transmission of even one logic-1 value from OR gate 1104 to ABIST engine 110 may be indicative a fail condition for memory array 150.

It is noted that the methods and apparatus described thus far and/or described later in this document may be achieved utilizing any of the known technologies, such as standard digital circuitry, analog circuitry, any of the known processors that are operable to execute software and/or firmware programs, programmable digital devices or systems, programmable array logic devices, or any combination of the above.

One or more embodiments of the invention may also be embodied in a software program for storage in a suitable storage medium and execution by a processing unit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for testing a memory array, comprising:
    (a) establishing a stored data vector, including a plurality of data bits, within at least one circuit;
    (b) applying one or more logical operations on the stored data vector to generate a succession of original data vectors at the at least one circuit;
    (c) transmitting the succession of original data vectors through the memory array to provide a succession of exercised data vectors;
    (d) comparing the succession of exercised data vectors to the succession of respective original data vectors; and
    (e) determining whether the memory array passes or fails based on the comparing step.

2. The method of claim 1, wherein the step of applying the one or more logical operations is performed recursively.

3. The method of claim 1, wherein steps (b) and (c) are performed sufficiently rapidly to dynamically test the memory array.

4. The method of claim 1, wherein the comparing step comprises:
    comparing a given original data vector to an exercised version of the given original data vector once for each cycle of a clock signal input to the at least one circuit.

5. An apparatus for testing a memory array, comprising:
    (a) means for establishing a stored data vector, including a plurality of data bits, within at least one circuit;
    (b) means for applying one or more logical operations on the stored data vector to generate a succession of original data vectors at the at least one circuit;
    (c) means for transmitting the succession of original data vectors through the memory array to provide a succession of exercised data vectors;
    (d) means for comparing the succession of exercised data vectors to the succession of respective original data vectors; and
    (e) means for determining whether the memory array passes or fails based on a comparison result.

6. The apparatus of claim 5, wherein means for applying performs the applying step recursively.

7. The apparatus of claim 5, wherein the means for establishing and the means for transmitting generate the original data vectors and transmit the original data vectors through the memory array sufficiently rapidly to dynamically test the memory array.

8. The apparatus of claim 5, wherein means for comparing compares a given original data vector to an exercised version of the given original data vector once for each cycle of a clock signal input to the at least one circuit.

9. A method for testing a memory array, comprising:
    (a) applying a first set of one or more logical operations to generate a plurality of successive data vectors;
    (b) storing the succession of data vectors in the memory array;
    (c) applying a second set of one or more logical operations to generate a plurality of successive expectation data values;
    (d) reading the plurality of data vectors from the memory array;
    (e) comparing the plurality of expectation data values to the plurality of respective read data vectors; and
    (f) determining whether the memory array passes or fails based on the comparing step.

10. The method of claim 9, wherein at least one of the step of applying a first set of one or more operations, and the step of applying a second set of one or more operations, is performed recursively.

11. The method of claim 9, wherein at least one of:
    the applying the first set of one or more logical operations comprises: first applying the first set of one or more logical operations to an initial data vector supplied to a write data generator; and
    the applying the second set of one or more logical operations comprises first applying the second set of one or more logical operations to an initial expectation data value supplied to an expectation data generator.

12. The method of claim 9, wherein steps (a) through (d) are performed sufficiently rapidly to dynamically test the memory array.

13. The method of claim 9, wherein at least one of:
    the first and second sets of one or more logical operations are the same; and
    an initial data vector used in the step of generating the plurality of data vectors and an initial expectation data value used in the step of generating the plurality of expectation values are the same.

14. The method of claim 9, wherein the comparing step compares one said read data vector to one said expectation data value for each cycle of a clock signal input to the memory array.

15. An apparatus for testing a memory array, comprising:
    (a) means for applying a first set of one or more logical operations to generate a plurality of successive data vectors;
    (b) means for storing the succession of data vectors in the memory array;
    (c) means for applying a second set of one or more logical operations to generate a plurality of successive expectation data values;
    (d) means for reading the plurality of data vectors from the memory array;
    (e) means for comparing the plurality of expectation data values to the plurality of respective read data vectors; and
    (f) means for determining whether the memory array passes or fails based on a result of the comparison,
    wherein the apparatus operates to perform the testing sufficiently rapidly to dynamically test the memory array.

16. The apparatus of claim 15, wherein the apparatus operates to at least one of:
    apply the first set of one or more operations recursively; and
    apply the second set of one or more operations recursively.

17. The apparatus of claim 15, wherein the apparatus operates to at least one of:
    first apply the first set of one or more logical operations to an initial data vector supplied to a write data generator; and
    first apply the second set of one or more logical operations to an initial expectation data value supplied to an expectation data generator.

18. The apparatus of claim 15, wherein the apparatus operates to compare one said read data vector to one said expectation data value for each cycle of a clock signal input to the memory array.

19. A method for testing a memory array, comprising:
providing an initial data vector, having a plurality of bits, in a write circuit;
performing at least one logical operation on the data vector to generate a plurality of successive data vectors;
storing the plurality of successive data vectors in a plurality of respective locations in the memory array;
reading the plurality of data vectors from the memory array; and
generating a test result from the read data vectors.

20. The method of claim 19, wherein at least one of:
the performing step is conducted recursively;
the performing step executing the performing step once for each cycle of a clock signal input to the write circuit;
the performing step and the storing step are repeated sufficiently rapidly to dynamically test the memory array;
the performing step comprises toggling at least one bit of each data vector, of the succession of data vectors, to provide a next data vector in the succession of data vectors; and
the performing step comprises toggling each bit of each data vector, of the succession of data vectors, to provide a next data vector in the succession of data vectors.

21. The method of claim 19, further comprising:
providing an initial expectation data value, having a plurality of bits, in an expectation data circuit; and
recursively performing at least one logical operation on the expectation data value to generate a plurality of successive expectation data values.

22. The method of claim 19, wherein at least one of:
the initial expectation data value is equal to the initial data vector;
the plurality of successive expectation data values are the same as the plurality of generated respective data vectors; and
the plurality of successive expectation data values are equal to the complements of the plurality of respective read data vectors.

23. The method of claim 21, further comprising:
reading the plurality of data vectors from the memory array; and
comparing each said generated expectation data value to a respective one of the read data vectors; and
generating the test result from the comparing step.

24. The method of claim 23, wherein the reading step comprises:
reading the data vectors from the memory array in a same order as the data vectors were generated in the performing step; and
comparing each bit of each generated expectation data value to a bit of corresponding bit order in the respective one of the read data vectors.

25. The method of claim 24, further comprising at least one of:
consolidating a result of the comparing step into a form suitable for communication to a control circuit within one cycle of a clock signal input to the memory array; and
consolidating a result of the comparing step into a single bit.

26. An apparatus for testing a memory array, comprising:
means for providing a initial data vector, having a plurality of bits, in a write circuit;
means for performing at least one logical operation on the data vector to generate a plurality of successive data vectors;
means for storing the plurality of successive data vectors in a plurality of respective locations in the memory array;
means for reading the plurality of data vectors from the memory array; and
means for generating a test result from the read data vectors.

27. The apparatus of claim 26, wherein the apparatus operates to at least one of:
recursively perform the at least one logical operation;
perform the logical operation once for each cycle of a clock signal input to the write circuit;
generate the plurality of successive data vectors and store the successive data vectors in the memory array sufficiently rapidly to dynamically test the memory array;
toggle at least one bit of each data vector, of the succession of data vectors, to provide a next data vector in the succession of data vectors; and
toggle each bit of each data vector, of the succession of data vectors, to provide a next data vector in the succession of data vectors.

28. The apparatus of claim 26, wherein the apparatus operates to:
provide an initial expectation data value, having a plurality of bits, in an expectation data circuit; and
perform at least one logical operation recursively on the expectation data value to generate a plurality of successive expectation data values.

29. The apparatus of claim 28, wherein at least one of:
the initial expectation data value is equal to the initial data vector;
the plurality of successive expectation data values are the same as the plurality of generated respective data vectors; and
the plurality of successive expectation data values are equal to the complements of the plurality of respective read data vectors.

30. The apparatus of claim 28, wherein the apparatus operates to:
read the plurality of data vectors from the memory array;
compare each said generated expectation data value to a respective one of the read data vectors; and
generate the test result from the comparing step.

31. The apparatus of claim 28, wherein the apparatus operates to:
read the data vectors from the memory array in a same order as the data vectors were generated in the performing step; and
compare each bit of each generated expectation data value to a bit of corresponding bit order in the respective one of the read data vectors.

32. The apparatus of claim 31, wherein the apparatus operates to at least one of:
consolidate a result of the comparing step into a form suitable for communication to a control circuit within one cycle of a clock signal input to the memory array; and
consolidate a result of the comparing step into a single bit.

33. The apparatus of claim 32, wherein the write data generator comprises:
a plurality of data-latches connected in series to form a scan chain.

34. The apparatus of claim 26, further comprising:
a write data generator in communication with the memory array.

35. The apparatus of claim 34, wherein the write data generator and the memory array are disposed within an array macro.

36. A method for testing a memory array, comprising:
(a) providing an initial expectation data value, having a plurality of bits, in an expectation data circuit;
(b) conducting at least one logical operation on the expectation data value to generate a plurality of successive expectation data values
(c) reading a plurality of data vectors from the memory array;
(d) comparing each said generated expectation data value to a corresponding one of the read data vectors, each said generated expectation data value and each said corresponding read data vector forming a vector pair; and
(e) determining whether the memory array passes or fails based on the comparing step.

37. The method of claim 36, wherein the conducting step is performed recursively.

38. The method of claim 36, wherein the conducting step comprises at least one of:
toggling at least one bit of each expectation data value; and
toggling each bit of each expectation data value.

39. The method of claim 36, wherein the comparing step comprises at least one of:
performing at least one logical operation using each said generated expectation data value and a corresponding read data vector to said generated expectation data value as inputs; and
comparing each bit of each generated expectation data value to a bit of corresponding bit order in the corresponding one of the read data vectors.

40. The method of claim 36 further comprising performing each of steps (b), (c), and (d) once in between successive instances of performing the determining step.

41. The method of claim 40 wherein within each instance of performing steps (b), (c), and (d), the comparing step is performed last.

42. The method of claim 36, wherein the determining step comprises:
indicating whether each generated expectation data value includes bits identical to the bits in the corresponding read data vector to which the generated expectation data value is compared in the comparing step.

43. An apparatus for testing a memory array, comprising:
(a) means for providing an initial expectation data value, having a plurality of bits, in an expectation data circuit;
(b) means for conducting at least one logical operation on the expectation data value to generate a plurality of successive expectation data values;
(c) means for reading a plurality of data vectors from the memory array;
(d) means for comparing each said generated expectation data value to a corresponding one of the read data vectors, each said generated expectation data value and each said corresponding read data vector forming a vector pair; and
(e) means for determining whether the memory array passes or fails based on a result of the comparison.

44. The apparatus of claim 43, further comprising:
a read circuit in communication with the memory array; and
a comparison circuit in communication with the expectation data circuit.

45. The apparatus of claim 44, wherein:
the read circuit comprises a plurality of data latches;
the expectation data circuit comprises a plurality of data latches; and
the comparison circuit comprises a plurality of digital logic gates, wherein each said digital logic gate operates to perform at least one logical operation on one bit of a given read data vector and one bit, of corresponding bit order, of an expectation data value being compared to the given read data vector, thereby providing a multi-bit comparison result.

* * * * *